(12) United States Patent
Irie

(10) Patent No.: US 7,858,288 B2
(45) Date of Patent: *Dec. 28, 2010

(54) POSITIVE RESIST COMPOSITION FOR IMMERSION EXPOSURE, METHOD OF FORMING RESIST PATTERN, AND FLUORINE-CONTAINING POLYMERIC COMPOUND

(75) Inventor: Makiko Irie, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 176 days.

This patent is subject to a terminal disclaimer.

(21) Appl. No.: 12/108,762

(22) Filed: Apr. 24, 2008

(65) Prior Publication Data

US 2008/0268376 A1 Oct. 30, 2008

(30) Foreign Application Priority Data

Apr. 27, 2007 (JP) ............... 2007-120320

(51) Int. Cl.
G03F 7/039 (2006.01)
G03F 7/20 (2006.01)
C08F 18/20 (2006.01)

(52) U.S. Cl. .................. 430/270.1; 430/326; 430/327; 430/273.1; 526/246

(58) Field of Classification Search ............... 526/246
See application file for complete search history.

(56) References Cited

U.S. PATENT DOCUMENTS

| | | | |
|---|---|---|---|
| 5,908,730 A | 6/1999 | Nitta et al. | |
| 5,945,517 A | 8/1999 | Nitta et al. | |
| 6,110,640 A * | 8/2000 | Kawamura et al. | 430/270.1 |
| 6,153,733 A | 11/2000 | Yukawa et al. | |
| 6,180,313 B1 | 1/2001 | Yukawa et al. | |
| 6,379,863 B1 * | 4/2002 | Oohashi et al. | 430/270.1 |
| 6,830,870 B2 * | 12/2004 | Malik et al. | 430/270.1 |
| 7,494,762 B2 * | 2/2009 | Irie et al. | 430/270.1 |
| 2005/0106500 A1 * | 5/2005 | Watanabe et al. | 430/270.1 |
| 2005/0164119 A1 * | 7/2005 | Maeda et al. | 430/270.1 |
| 2005/0282985 A1 | 12/2005 | Koyama et al. | |
| 2006/0058480 A1 | 3/2006 | Koyama et al. | |
| 2006/0246373 A1 * | 11/2006 | Wang | 430/270.1 |
| 2007/0072115 A1 * | 3/2007 | Hatakeyama et al. | 430/270.1 |
| 2007/0134588 A1 * | 6/2007 | Kanda et al. | 430/270.1 |
| 2007/0134589 A1 * | 6/2007 | Yamamoto et al. | 430/270.1 |
| 2007/0148589 A1 * | 6/2007 | Kanda et al. | 430/270.1 |
| 2007/0218401 A1 * | 9/2007 | Ando et al. | 430/270.1 |
| 2008/0090171 A1 * | 4/2008 | Irie et al. | 430/270.1 |

FOREIGN PATENT DOCUMENTS

| | | |
|---|---|---|
| JP | H9-208554 | 8/1997 |
| JP | H11-35551 | 2/1999 |
| JP | H11-35552 | 2/1999 |
| JP | H11-35573 | 2/1999 |
| JP | 11-322707 | 11/1999 |
| JP | 2001-100403 A * | 4/2001 |

OTHER PUBLICATIONS

English translation of JP, 2001-100403, A (2001) from machine translation from AIPN Japan Patent Office National Center for Industrial Property Information and Training, generated Dec. 9, 2009, 16 pages.*

D. Gil et al., *First Microprocessors with Immersion Lithography*, Proceedings of SPIE, vol. 5754, pp. 119-128, (2005).

Kodama et al., *Synthesis of Novel Fluoropolymer for 157nm Photoresists by Cyclo-polymerization*, Proceedings of SPIE, vol. 4690, pp. 76-83, (2002).

Yamaoka et al., *Water-Soluble Fluorine-Containing Amphiphilic Block Copolymer: Synthesis and Aggregation Behavior in Aqueous Solution*, Macromolecules, vol. 32, pp. 7122-7127, (1999).

* cited by examiner

*Primary Examiner*—Cynthia Hamilton
(74) *Attorney, Agent, or Firm*—Knobbe, Martens Olson & Bear, LLP

(57) ABSTRACT

A fluorine-containing polymeric compound obtained by polymerizing only polymerizable monomers represented by general formula (c1-0) shown below:

[Chemical Formula 1]

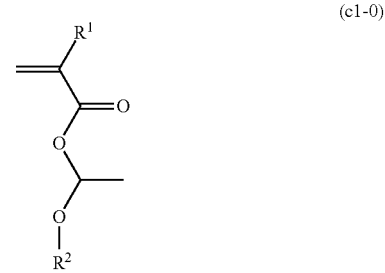

(c1-0)

wherein $R^1$ represents a hydrogen atom or a methyl group; $R^2$ represents an aliphatic hydrocarbon group substituted with fluorine atoms, or a group in which a plurality of aliphatic hydrocarbon groups which may be substituted with fluorine atoms are bonded through a linking group containing a hetero atom, with the proviso that at least one of the plurality of aliphatic hydrocarbon groups which may be substituted with fluorine atoms is an aliphatic hydrocarbon group substituted with fluorine atoms.

10 Claims, No Drawings

US 7,858,288 B2

POSITIVE RESIST COMPOSITION FOR IMMERSION EXPOSURE, METHOD OF FORMING RESIST PATTERN, AND FLUORINE-CONTAINING POLYMERIC COMPOUND

RELATED APPLICATIONS

This application claims priority under 35 U.S.C. §119(a)-(d) to Japanese Patent Application No. 2007-120320, filed Apr. 27, 2007, the content of which is incorporated herein by reference in its entirety.

TECHNICAL FIELD

The present invention relates to a positive resist composition for immersion exposure containing a fluorine-containing polymeric compound suitable for immersion exposure (liquid immersion lithography), a method of forming a resist pattern, and the fluorine-containing polymeric compound.

BACKGROUND ART

In lithography techniques, for example, a resist film composed of a resist material is formed on a substrate, and the resist film is subjected to selective exposure of radial rays such as light or electron beam trough a mask having a predetermined patter, followed by development, thereby forming a resist pattern having a predetermined shape on the resist film. A resist material in which the exposed portions become soluble in a developing solution is called a positive-type, and a resist material it which the exposed portions become insoluble in a developing solution is called a negative-type.

For miniaturization of semiconductor devices, shortening of the wavelength of the exposure light source, and increasing of the numerical aperture (NA) of the projector lens have progressed Currently, exposure apparatuses in which an ArF excimer laser having a wavelength of 193 nm is used as an exposure light source and NA=0.84 have been developed. As shortening the wavelength of the exposure light source progresses, it is required to improve various lithography properties of the resist material, such as the sensitivity to the exposure light source and a resolution capable of reproducing patterns of minute dimensions. As a resist material which satisfies these conditions, a chemically amplified resist is used, which includes a base resin that exhibits a changed solubility in an alkali developing solution under action of acid and an acid generator that generates acid upon exposure.

Currently, resins that contain structured units derived from (meth)acrylate esters within the main chain (acrylic resins) are now widely used as base resins for resists that use ArF excimer laser lithography, as they exhibit excellent transparency in the vicinity of 193 nm. Here, the term "(meth)acrylic acid" is a generic term that includes either or both of acrylic acid having a hydrogen atom bonded to the α-position and methacrylic acid having a methyl group bonded to the α-position. The term "(meth)acrylate ester" is a generic term that includes either or both of the acrylate ester having a hydrogen atom bonded to the α-position and the methacrylate ester having a methyl group bonded to the α-position.

The term "(meth)acrylate" is a generic term that includes either or both of the acrylate having a hydrogen atom bonded to the α-position and the methacrylate having a methyl group bonded to the α-position.

As a technique fox further improving the resolution, a lithography method called liquid immersion lithography (hereafter, frequently referred to as "immersion exposure") is known in which exposure (immersion exposure) is conducted in a state where the region between the lens and the resist layer formed on a wafer is filled with a solvent (a immersion medium) that has a larger refractive index than the refractive index of air (see for example, Non-Patent Document 1).

According to this type of immersion exposure, it is considered that higher resolutions equivalent to those obtained using a shorter wavelength light source or a larger NA lens can be obtained using the same exposure light source wavelength, with no lowering of the depth of focus. Furthermore, immersion exposure can be conducted using a conventional exposure apparatus. As a result, it is expected that immersion exposure will enable the formation of resist patterns of higher resolution and superior depth of focus at lower costs. Accordingly, in the production of semiconductor devices, which requires enormous capital investment, immersion exposure is attracting considerable attention as a method that offers significant potential to the semiconductor industry, both in terms of cost and in terms of lithography properties such as resolution.

Immersion lithography is effective in forming patterns having various shapes. Further, immersion exposure is ex to be capable of being used in combination with currently studied super-resolution techniques, such as phase shift method and modified illumination method. Currently, as the immersion exposure technique, technique using an ArF excimer laser as an exposure source is being actively studied, and water is mainly used as the immersion medium.

In recent years, fluorine-containing compounds have been attracting attention for their properties such as water repellency and transparency, and active research and development of fluorine-containing compounds have been conducted in various fields. For example, in the fields of resist materials, currently, an acid-labile group such as a methoxyethyl group, tert-butyl group or tert-butoxycarbonyl group is being introduced into a fluorine-containing polymeric compound, and the fluorine-containing polymeric compound is used as a base resin for a chemically amplified positive resist. However, when such a fluorine-containing polymeric compound is used as a base resin for a chemically amplified positive resist a disadvantage is caused in that the etching resistance is unsatisfactory.

Recently, as a fluorine-containing polymeric compound exhibiting excellent etching resistance, a fluorine-containing polymeric compound having an acid-labile group containing a cyclic hydrocarbon group has been reported (see, for example, Non-Patent Document 2).

[Non-Patent Document 1] Proceedings of SPIE (U.S.), vol. 5754, pp. 119-128 (2005)

[Non-Patent Document 2] Proceedings of SPIE (U.S.), vol. 4690, pp. 76-83 (2002)

DISCLOSURE OF INVENTION

Means to Solve the Problems

In immersion exposure, it is required to use a resist material which exhibits not only general lithography properties (e.g., sensitivity, resolution, etching resistance and the like), but also properties suited for immersion lithography. For example, in immersion exposure, when the immersion medium comes in contact with the immersion medium, elution of a substance contained in the resist into the immersion medium occurs. This elution of a substance causes phenomenons such as degeneration of the resist film and change in the refractive index of the immersion medium, thereby adversely affecting the lithography properties. The amount of the eluted substance is affected by the properties of the resist film surface (e.g., hydrophilicity, hydrophobicity, and the like). For example, by enhancing the hydrophobicity of the resist film surface, the elution of a substance can be reduced. Further, when the immersion medium is water and immersion exposure is performed using a scanning-type immersion exposure apparatus as disclosed in Non-Patent Document 1, tag ability of water with respect to the movement of the lens (hereafter, frequently referred to as "water tracking ability") is required. When the water tracking ability is low, the exposure speed becomes low, and as a result, there is a possibility that the productivity is adversely affected. It is presumed that the water tacking ability can be improved by enhancing the hydrophobicity of the resist film (rendering the resist film hydrophobic).

Thus, it is presumed that the above-described characteristic problems of immersion lithography such as reducing elution of a substance and improving the water tracking ability can be solved by enhancing the hydrophobicity of the resist film surface. However, when the resist film is simply rendered hydrophobic, lithography properties are adversely affected. Especially, when the hydrophobicity of the resist film is high, a foreign substance such as a positive resist composition for immersion exposure dissolved by the developing solution is likely to adhere to the resist film surface, and hence, serious problems are caused in terms of quality control.

It is considered that a resist material which is hydrophobic during immersion exposure and then becomes hydrophilic following post exposure take (PEB) can solve the above-described problems. However, a material exhibiting such property, as well as required lithography properties is almost unknown.

The present invention takes the above circumstances into consideration, with an object of providing a fluorine-containing polymeric compound suitable for a positive resist composition for immersion exposure which exhibits satisfactory hydrophobicity for immersion exposure and becomes hydrophilic following PEB, and also exhibits excellent lithography properties; a resist composition containing the fluorine-containing polymeric compound; and a method of forming a resist pattern.

Means to Solve the Problems

A first aspect of the present invention for solving the above-mentioned problems is a positive resist composition for immersion exposure including a base component (A) which exhibits increased solubility in an alkali developing solution under action of acid and has no structural unit (c1) represented by general formula (c1-1) shown below, an acid-generator component (B) which generates acid upon irradiation, and a fluorine-containing polymeric compound (C) obtained by polymerizing only polymerizable monomers represented by general formula (c1-0) shown below:

[Chemical Formula 1]

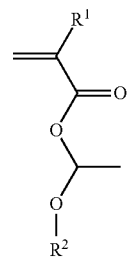

(c1-0)

wherein $R^1$ represents a hydrogen atom or a methyl group; $R^2$ represents an aliphatic hydrocarbon group substituted with fluorine atoms, or a group in which a plurality of aliphatic hydrocarbon groups which may be substituted with fluorine atoms are bonded through a linking group containing a hetero atom, with the proviso that at least one of the plurality of aliphatic hydrocarbon groups which may be substituted with fluorine atoms is an aliphatic hydrocarbon group substituted with fluorine atoms; and

[Chemical Formula 2]

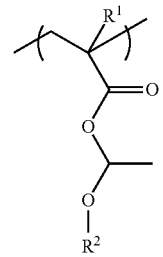

(c1-1)

wherein $R^1$ represents a hydrogen atom or a methyl group; $R^2$ represents an aliphatic hydrocarbon group substituted with fluorine atoms, or a group in which a plurality of aliphatic hydrocarbon groups which may be substituted with fluorine atoms are bonded though a linking group containing a hetero atom, with the proviso that at least one of the plurality of aliphatic hydrocarbon groups which may be substituted with fluorine atoms is an aliphatic hydrocarbon group substituted with fluorine atoms.

Alternatively, the positive resist composition for immersion exposure according to the first aspect of the present invention may include a base component (A) which exhibits increased solubility in an alkali developing solution under action of acid and has no structural unit (c1) represented by general formula (c1-1) shown above, an acid-generator component (B) which generates acid upon irradiation, and a fluorine-containing polymeric compound (C) consisting of a structural unit (c1) represented by general formula (c1-1) shown above.

A second aspect of the present invention is a method of forming a resist pattern, including: applying a positive resist composition for immersion exposure according to the first aspect of the present invention to a substrate to form a resist film on the sure; subjecting the resist film to immersion exposure; and developing the resist film to form a resist pattern.

A third aspect of the present invention is a fluorine-containing polymeric compound obtained by polymerizing only polymerizable monomers represented by general formula (c1-0) show above.

Alternatively, the fluorine-containing polymeric compound according to the third aspect of the present invention may consist of a structural unit (c1) represented by general formula (c1-1) shown above.

In the present description and claims, an "alkyl group" includes linear, branched or cyclic, monovalent saturated hydrocarbon, unless otherwise specified.

A "lower alkyl group" is an alkyl group of 1 to 5 carbon atoms.

An "alkylene group" includes linear, branched or cyclic, divalent saturated hydrocarbon, unless otherwise specified.

The term "structural unit" refers to a monomer unit that contributes to the formation of a polymeric compound (polymer).

The term "exposure" is used as a general concept that includes irradiation with any form of radiation.

The term "aliphatic" is a relative concept used in relation to the term "aromatic", and defines a group or compound that has no aromaticity.

Effect of the Invention

According to the present invention, there are provided a fluorine-coning polymeric compound suitable for a positive resist composition for immersion exposure which exhibits satisfactory hydrophobicity for immersion exposure and becomes hydrophilic following PEB, and also exhibits excellent lithography properties; a resist composition containing the fluorine-containing polymeric compound; and a method of forming a resist pattern.

BEST MODE FOR CARRYING OUT THE INVENTION

Fluorine-Containing Polymeric Compound

First, the fluorine-containing polymeric compound according to the third aspect of the present invention will be described.

The fluorine-containing polymeric compound of the present invention is obtained by polymerizing only monomer units represented by general formula (c1-0) shown below.

[Chemical Formula 3]

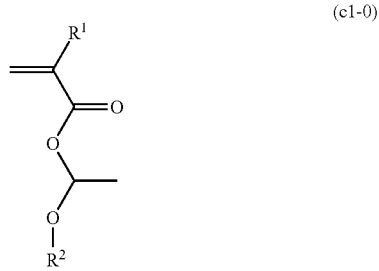

(c1-0)

wherein $R^1$ represents a hydrogen atom or a methyl group; $R^2$ represents an aliphatic hydrocarbon group substituted with fluorine atoms, or a group in which a plurality of aliphatic hydrocarbon groups which may be substituted with fluorine atoms axe bonded through a liking group containing a hetero atom, with the proviso that at least one of the plurality of aliphatic hydrocarbon groups which may be substituted with fluorine atoms is an aliphatic hydrocarbon group substituted with fluorine atoms.

In general formula (c1-0), $R^1$ represents a hydrogen atom or a methyl group, and is preferably a methyl group.

$R^2$ represent an aliphatic hydrocarbon group substituted with fluorine atoms, or a group in which a plurality of aliphatic hydrocarbon groups which may be substituted with fluorine atoms are bonded through a lining group containing a hetero atom, with the proviso that at least one of the plurality of aliphatic hydrocarbon groups which may be substituted with fluorine atoms is an aliphatic hydrocarbon group substituted with fluorine atoms.

With respect to $R^2$, an "aliphatic hydrocarbon group" refers to a hydrocarbon group having no aromaticity, and may be linear, branched or cyclic. The cyclic hydrocarbon group may be monocyclic or polycyclic. Among these, linear or branched hydrocarbon groups of 2 to 20 carbon atoms are preferable.

With respect to $R^2$, the "aliphatic hydrocarbon group substituted with fluorine atoms" may be an aliphatic hydrocarbon group in which at least one hydrogen atom has been substituted with a fluorine atom. Alternatively, the "aliphatic hydrocarbon group substituted with fluorine atoms" may be a group in which an aliphatic hydrocarbon group substituted with fluorine atoms is bonded to an aliphatic hydrocarbon group not substituted with fluorine atoms.

With respect to the "aliphatic hydrocarbon group substituted with fluorine atoms", the substitution position of the fluorine atoms is not particularly limited. However, in terms of suppressing lowering of the acid dissociability, it is preferable that the fluorine atoms be bonded to a β-position or position further from the β-position (e.g., a γ-position or a δ-position) of the oxygen atom to which $R^2$ is bonded. Further, it is preferable that the α position of the oxygen atom be not substituted with fluorine atoms. The number of fluorine atoms as the substituents may be one or more, but in terms of suppressing swelling of a resist pattern in water, the number of fluorine atoms as substituents is preferably two or more, more preferably three or more. On the other hand, in terms of stability of the functional group, the number of fluorine atoms as substituents is preferably no more than 30, more preferably no more than 15.

Examples of the "aliphatic hydrocarbon group substituted with fluorine atoms" for $R^2$ include fluorinated alkyl groups; fluorinated cycloalkyl groups; bridge structure-containing fluorinated aliphatic cyclic groups; groups in which one or more of these groups are bonded together; and groups in which one or more of these groups are bonded to one or more aliphatic hydrocarbon groups not substituted with fluorine atoms.

A fluorinated alkyl group is a group in which at least one hydrogen atom of an alkyl group has been substituted with a fluorine atom (fluoroalkyl group). Specific examples thereof include linear or branched fluorinated alkyl groups of 1 to 30 carbon atoms, such as a fluorinated methyl group (e.g., a trifluoromethyl group), fluorinated ethyl group (e.g., pentafluoroethyl group or 2,2,2-trifluoroethyl group); fluorinated propyl group (e.g., heptafluoropropyl group, 2,2,3,3,3-pentafluoropropyl group or 2,2,3,3-tetrafluoropropyl group); fluorinated isopropyl group (e.g., 2,2,2-trifluoro-1-(trifluoromethyl)ethyl) group); fluorinated butyl group (e.g., nonafluorobutyl group or 4,4,4-trifluorobutyl group); fluorinated isobutyl group; fluorinated sec-butyl group; fluorinated tert-butyl group; fluorinated pentyl group (e.g., undecafluoropentyl group, 2,2,3,3,4,4,5,5,5-nonafluoropentyl group or 2,2,3,3,4,4,5,5-octafluoropentyl group); fluorinated hexyl group (e.g., tridecafluorohexyl group, 2,2,3,3,4,4,5,5,6,6,6-undecafluorohexyl group or 2,2,3,3,4,4,5,5,6,6-decafluorohexyl group, 3,3,4,4,5,5,6,6,6-nonafluorohexyl group); fluorinated heptyl group (e.g., pentadecafluoroheptyl group; 2,2,3,3,4,4,5,5,6,6,7,7,7-tridecafluoroheptyl group, or 2,2,3,3,4,4,5,5,6,6,7,7-dodecafluoroheptyl group); fluorinated octyl group (heptadecafluorooctyl group or 2,2,3,3,4,4,5,5,6,6,7,7,8,8,8-pentadecafluoroalkyl group); fluorinated nonyl group (e.g., nonadecafluorononyl group or 2,2,3,3,4,4,5,5,6,6,7,7,9,8,9,9,9-heptadecaduoronoayl group); fluorinated decyl group (e.g., henicosafluorodecyl group or 2,2,3,3,4,4,5,5,6,6,7,7,8,8,9,9,10,10,10-nonadecafluorodecyl group); fluorinated dodecyl group; fluorinated tetradecyl group; fluorinated hexadecyl group; and fluorinated octadecyl group.

A fluorinated cycloalkyl group is a group in which at least one hydrogen atom of a cycloalkyl group has been substituted with a fluorine atom (fluorocycloalkyl group). Specific examples thereof include fluorocycloalkyl groups of 3- to 20-membered ring, such as a monofluorocyclopentyl group, difluorocyclopentyl group, nonafluorocyclopentyl group, monofluorocyclohexyl group, difluorocyclohexyl group, and undecafluorocyclohexyl group. The fluorocycloalkyl group is preferably 5- to 20-membered ring, and more preferably 5- to 15-membered ring.

Specific examples of the bridge structure-containing fluorinated aliphatic cyclic group include a fluorinated norbornyl group, fluorinated adamantyl group, fluorinated bornyl group, fluorinated isobornyl group, fluorinated tricyclo[5.2.1.0$^{2,6}$]decyl group, fluorinated tetracyclo[4.4.0.1$^{2,5}$.1$^{7,10}$]dodecyl group and fluorinated decalinyl group.

The aliphatic hydrocarbon group not substituted with fluorine atoms, which may be bonded to one or more groups selected from the fluorinated alkyl groups, the fluorinated cycloalkyl groups and the bridge structure-containing fluorinated aliphatic cyclic groups is not particularly limited, as long as it is an aliphatic hydrocarbon group. The aliphatic hydrocarbon group may be a linear or branched alkyl group of 1 to 20 carbon atoms such as a methyl group, ethyl group, propyl group, isopropyl group, butyl group, isobutyl group, sec-butyl group, tert-butyl group, hexyl group or octyl group. The alkyl group preferably has 1 to 10 carbon atoms, more preferably 1 to 5 carbon atoms. Alternatively, the aliphatic hydrocarbon group may be a cycloalkyl group of 3- to 15-membered ring, such as a cyclopropyl group, cyclobutyl group, cyclopentyl group, or cyclohexyl group. The cycloalkyl group is preferably 3- to 8-membered ring, more preferably 5- to 6-membered ring. Further, the aliphatic hydrocarbon group may be a bridge structure-containing aliphatic cyclic group of 6 to 20 carbon atoms, such as a norbornyl group, adamantyl group, bornyl group, isobornyl group, tricyclo[5.2.1.0$^{2,6}$]decyl group, tetracyclo[4.4.0.1$^{2,5}$.1$^{7,10}$]dodecyl group or decalinyl group.

It is particularly desirable that the "aliphatic hydrocarbon group substituted with fluorine atoms" for $R^2$ be a linear or branched fluorinated alkyl group of 1 to 30 carbon atoms. The linear or branched fluorinated alkyl group preferably has 1 to 20 carbon atoms, more preferably 2 to 17 carbon atoms, and still more preferably 2 to 15 carbon atoms. Further, the "aliphatic hydrocarbon group substituted with fluorine atoms" for $R^2$ is preferably a perfluoroalkyl group in which all hydrogen atoms of the alkyl group have been substituted with fluorine atoms, more preferably a perfluoroalkyl group of 2 to 5 carbon atoms, and most preferably a trifluoroethyl group.

With respect to the "group in which a plurality of aliphatic hydrocarbon groups which may be substituted with fluorine atoms are bonded through a linking group containing a hetero atom", examples of the "aliphatic hydrocarbon groups which may be substituted" include those exemplified above in connection with the "aliphatic hydrocarbon group substituted with fluorine atoms"; divalent groups corresponding to these "aliphatic hydrocarbon group substituted with fluorine atoms"; and "aliphatic hydrocarbon group not substituted with fluorine atoms" corresponding to these "aliphatic hydrocarbon group substituted with fluorine atoms". Examples of such divalent groups include linear or branched alkylene group of 1 to 10 carbon atoms, such as a methylene group, ethylene group, ethylidene group, trimethylene group, propylene group, isopropylidene group, tetramethylene group and hexamethylene group; cycloalkylene groups of 3- to 8-membered ring, such as 1,2-cyclopentylene group, 1,3-cyclopentylene group, cyclopentylidene group, 1,2-cyclohexylene group, 1,3-cyclohexylene group, 1,4-cyclohexylene group and cyclohexylidene group; divalent bridge structure-containing alicyclic groups such as norbornanediyl group and adamantanediyl group; divalent aliphatic hydrocarbon groups not substituted with fluorine atoms, such as groups in which two or more of these groups are bonded together; and groups in which at least one hydrogen atom of these groups is substituted with a fluorine atom.

Examples of the "linking group containing a hetero atom" within $R^2$ include an oxygen atom (ether bond: —O—), sub atom (thioether bond: —S—), —NH— bond (this group may be substituted with an alkyl group, an acyl group or the like), ester bond (—COO—), amido bond (—CONH—), carbonyl group (—CO—) and carbonate bond (—OCOO—). Among these, an oxygen atom (ether bond: —O—) and sulfur atom (thioether bond: —S—) are particularly desirable.

When $R^2$ represents "a group in which a plurality of aliphatic hydrocarbon groups which may be substituted with fluorine atoms are bonded trough a linking group conning a hetero atom", at least one of the plurality of aliphatic hydrocarbon groups which may be substituted with fluorine atoms is an aliphatic hydrocarbon group substituted with fluorine atoms. In terms of suppressing the lowering of acid dissociability, it is preferable that the aliphatic hydrocarbon group substituted with fluorine atoms be bonded to the oxygen atom through at least one unit consisting of an aliphatic hydrocarbon group not substituted with fluorine atoms and a linking group.

Examples of the "group in which a plurality of aliphatic hydrocarbon groups which may be substituted with fluorine atoms are bonded through a linking group containing a hetero atom" include groups represented by general formula (p0) shown below.

[Chemical Formula 4]

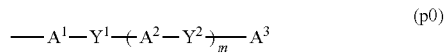

(p0)

wherein $A^1$ and $A^2$ each independently represents a divalent aliphatic hydrocarbon group which may be substituted with fluorine atoms, wherein $A^1$ and $A^2$ may be the same or different, $A^3$ represents a monovalent aliphatic hydrocarbon group which may be substituted with fluorine atoms; $Y^1$ and $Y^2$ each independently represents a linking group containing a hetero atom, wherein $Y^1$ and $Y^2$ may be the same or different; and m represents 0 or an integer of 1 or more; with the proviso that at least one of $A^1$, m $A^2$s and $A^3$ represents an aliphatic hydrocarbon group substituted with fluorine atoms, and when m is 2 or more, the m $A^2$s may be the same or different, and the m $Y^2$s may be the same or different.

In general formula (p0) above, it is preferable that at least one of m $A^2$s and $A^3$ be an aliphatic hydrocarbon group substituted with fluorine atoms, and it is more preferable that $A^3$ be an aliphatic hydrocarbon group substituted with fluorine atoms. Further, it is preferable that $A^1$ be an aliphatic hydrocarbon group not substituted with fluorine atoms. m is generally 0 to 10, preferably 0 to 5, more preferably 0 to 2, and most preferably 0.

In general formula (p0) above, as the "divalent aliphatic hydrocarbon group which may be substituted with fluorine atoms", the same as the divalent aliphatic hydrocarbon groups mentioned above in connection with the "aliphatic hydrocarbon group which may be substituted with fluorine atoms" can be exemplified. As the "monovalent aliphatic hydrocarbon group which may be substituted with fluorine atoms", the same as those mentioned above in connection with the "aliphatic hydrocarbon group substituted with fluorine atoms" and the corresponding "aliphatic hydrocarbon group not substituted with fluorine atoms" can be exemplified. As the "linking group containing a hetero atom", the same as those mentioned above in connection with the "biting group containing a hetero atom" within $R^2$ can be exemplified.

Representative examples of polymerizable monomers represented by general formula (c1-0) shown above include compounds in which $R^2$ is an aliphatic hydrocarbon group substituted with fluorine atoms, such as 1-(2-fluoroethoxy) ethyl(meth)acrylate, 1-(2,2-difluoroethoxy)ethyl(meth)acrylate, 1-(2,2,2-trifluoroethoxy)ethyl(meth)acrylate, 1-(2,2,3,3,3-pentafluoropropoxy)ethyl(meth)acrylate, 1-(2,2,3,3-tetrafluoropropoxy)ethyl(meth)acrylate, 1-(4,4,4-trifluorobutoxy)ethyl (meth)acrylate, 1-(2,2,3,3,4,4,4-heptafluorobutoxy)ethyl(meth)acrylate and 1-(2,2,3,3,4,4,5,5-octafluoropentoxy)ethyl(meth)acrylate; and compounds in which $R^2$ is a group represented by general formula (p0) above, such as 1-[2-(2-fluoroethoxy)ethoxy]ethyl(meth)acrylate, 1-[2-(2,2-difluoroethoxy)ethoxy]ethyl (meth)acrylate, 1-[2-(2,2,2-trifluoroethoxy)ethoxy]ethyl(meth)acrylate, 1-[2-(2,2,3,3,3-pentafluoropropoxy)ethoxy]ethyl(meth)acrylate, 1-[2-(2,2,3,3-tetrafluoropropoxy)ethoxy]ethyl (meth)acrylate, 1-[2-(2,2,3,3,4,4,4-heptafluorobutoxy)ethoxy]ethyl(meth)acrylate and 1-[2-(2,2,3,3,4,4-hexafluorobutoxy)ethoxy]ethyl(meth)acrylate. As the polymerizable monomer represented by general formula (c1-0), 1-(2,2,2-trifluoroethoxy)ethyl (meth)acrylate or 1-[2-(2,2,2-trifluoroethoxy)ethoxy]ethyl(meth)acylate is preferable.

The polymerizable monomer represented by general formula (c1-0) can be produced, for example, by reacting (meth)acrylic acid represented by general formula (q1) shown below with a vinylether compound represented by general formula (q2) shown below in a solvent or without a solvent, as shown by the reaction formula below.

[Chemical Formula 5]

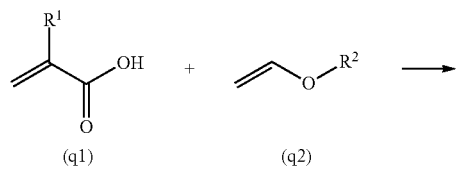

(q1)        (q2)

-continued

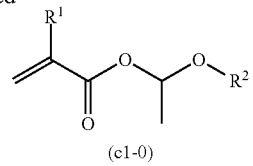

(c1-0)

The above reaction would proceed without a catalyst, but the reaction can be promoted by using an acid catalyst. The acid catalyst is not particularly limited, and either an inorganic acid or an organic acid may be used Examples of inorganic acids include mineral acids, such as hydrochloric acid, sulfuric acid, nitric acid, phosphoric acid and boric acid, heteropolyacids, such as phosphomolybdic acid, silicomolybdic acid, phosphotungstic acid and silicotungstic acid; and solid catalysts, such as zeolite. Examples of organic acids include carboxylic acids, such as formic acid, acetic acid and trifluoroacetic acid; and sulfonic acids, such as methanesulfonic acid, trifluoromethanesulfonic acid, benzenesulfonic acid, p-toluenesulfonic acid and naphthalenesulfonic acid. Alternatively, as the acid catalyst, a cationic ion exchange resin may be used. Further, a Lewis acid may also be used. Furthermore, among the above-exemplified acids, for those which are capable of forming a salt, a pyridinium salt, an ammonium salt an alkali metal salt, an alkaline earth metal salt or a transition metal salt thereof may be used. Among these, in terms of the yield and conversion ratio of the objective compound, phosphoric acid, trifluoroacetic acid and sulfuric acid are particularly desirable.

The solvent is not particularly limited as long as it is inert during the reaction, and examples thereof include linear or branched aliphatic hydrocarbons such as hexane and octane; cyclic aliphatic hydrocarbons such as cyclohexane and methylcyclohexane; aromatic hydrocarbons such as benzene, toluene and xylene; halogenated hydrocarbons such as methylene chloride; ethers such as tetrahydrofuran and ethylene glycol dimethyl ether, and aprotic polar solvents such as N,N-dimethylformamide.

The amount of (meth)acrylic acid represented by general formula (q1) above used is, for example, 0.5 to 50 moles, preferably 0.9 to 10 moles, per 1 mole of the vinylether compound represented by general formula (q2) above. The amount of the acid catalyst used is, for example, 0.0001 to 1 mole, preferably 0.001 to 0.3 mole, per 1 mole of the vinylether compound represented by general formula (q2) above.

For preventing polymerization of the vinylether compound represented by general formula (q2) above and the reaction product, it is preferable to add a polymerization inhibitor such as 4-methoxyphenol to the reaction system in a small amount. The amount of the polymerization inhibitor added is, for example, 0.00001 to 0.05 mole, preferably 0.0001 to 0.01 mole, per 1 mole of the vinylether compound represented by general formula (q2) above.

The reaction temperature depends on the types of the reaction materials and the type of the catalyst used, but is generally from −10 to 100° C., preferably from 0 to 60° C.

After the completion of the reaction, the reaction product can be separated and purified by controlling the property of the reaction liquid, extraction, concentration, distillation, crystallization, recrystallization, column chromography, or the like.

The fluorine-containing polymeric compound of the present invention is obtained by polymerizing only polymerizable monomers represented by general formula (c1-0) above. Generally, when only polymerizable monomers represented by general formula (c1-0) above are polymerized, a fluorine-containing polymeric compound consisting of a structural unit (c1) represented by general formula (c1-1) is obtained. However, the polymerizable monomers represented by general formula (c1-0) above are hemiacetal esters of (meth)acrylic acid. Therefore, depending on the polymerization reaction conditions, some of the structural units of the obtained polymer may have the hemiacetal portion eliminated. The fluorine-containing polymeric compound may be obtained by polymerizing either one type of polymerizable monomer represented by general formula (c1-0) above, or two or more types of polymerizable monomers represented by general formula (c1-0) above. The polymerization method is not particularly limited, and a conventionally known method can be used.

As explained above, the fluorine-containing polymeric compound of the present invention has a hemiacetal ester structure, and hence, the hemiacetal portion is eliminated by acid, thereby generating a free carboxy group. Further, by virtue of the fluorine-containing group, the fluorine-containing polymeric compound exhibits high hydrophobicity. Therefore, the fluorine containing polymeric compound of the present invention can be preferably used as a material for a positive resist composition for immersion exposure.

<<Positive Resist Composition for Immersion Exposure>>

Next, the positive resist composition for immersion exposure according to the first aspect of the present invention will be described.

The positive resist composition for immersion exposure according to the present invention includes a base component (A) (hereafter, referred to as "component (A)") which exhibits increased solubility in an alkali developing solution under action of acid and has no structural unit (c1) represented by general formula (c1-1) shown above, an acid-generator component (B) (hereafter, referred to as "component (B)") which generates acid upon irradiation, and a fluorine-containing polymeric compound (C) obtained by polymerizing only polymerizable monomers represented by general formula (c1-0) shown above. The component (C) may be a fluorine-containing polymeric compound (C) consisting of a structural unit (c1) represented by general formula (c1-1) shown above.

In the positive resist composition, the component (A) exhibits increased solubility in an alkali developing solution under action of acid. Therefore, in the formation of a resist pattern, by conducting selective exposure of a resist film formed by using the positive resist composition, the exposed portions become alkali soluble, whereas the unexposed portions remain alkali-insoluble, and hence, a resist pattern can be formed by alkali developing.

<Component (A)>

The component (A) is not particularly limited as long as it contains no structural unit (c1), and it can be appropriately selected from any of the multitude of base components which have been conventionally proposed for use in a chemically amplified positive resist composition, such as a base component used within resist compositions for KrF excimer lasers, ArF excimer laser; or the like. With respect to the structural unit (c1), explanation will be given under the item of "component (C)".

As the component (A), a base component which has acid dissociable, dissolution inhibiting groups and is insoluble in an alkali developing solution is generally used. When acid acts on such a base component, the acid dissociable, dissolution inhibiting groups within the base component dissociate, and the groups soluble in an alkali developing solution are exposed, thereby increasing the solubility of the base component in the alkali developing solution. Therefore, in the formation of a resist pattern, by conducting selective exposure of a resist film formed by using the positive resist composition, the solubility of the exposed portions in an alkali developing solution is increased and hence, a resist pattern can be formed by alkali developing.

The term "base component" refers to an organic compound capable of forming a film.

Preferable examples of the base component include organic compounds having a molecular weight of 500 or more. When the organic compound has a molecular weight of 500 or more, the film-forming ability is improved, and a pattern of nano level can be easily formed.

The organic compounds having a molecular weight of 500 or more are broadly classified into low molecular weight organic compounds having a molecular weight of 500 to less than 2,000 (hereafter, frequently referred to as "low molecular weight compounds") and high molecular weight resins (polymers) having a molecular weight of 2,000 or more. Generally, as the aforementioned low molecular weight compound, a non-polymer (monomer) is used. With respect to the aforementioned resin (polymer), the molecular weight is the polystyrene equivalent value determined by gel permeation chromatography (CPC). Hereafter, a "resin" refers to a resin having a molecular weight of 2,000 or more.

The component (A) may be a low molecular weight compound exhibiting increased solubility in an alkali developing solution under action of acid, a resin (A1) exhibiting increased solubility in an alkali developing solution under action of acid, or a mixture thereof. In consideration of compatibility with the component (C) and availability, the component (A) is preferably a resin (A1) (hereafter, frequently referred to as "component (A1)").

In the present invention, the component (A1) is preferably a resin having a structural unit derived from an acrylate ester. Such a resin exhibits high transparency to ArF excimer lasers, and can be preferably used in lithography techniques using an ArF excimer laser.

In the present invention, in the component (A1), the amount of structural units derived from an acrylate ester, based on the combined total of all structural units constituting the component (A1) is preferably from 20 to 100 mol %, more preferably 50 to 100 mol %, and may be even 100 mol %.

In the present descriptions and the claims, the term "structural unit derived from an acrylate ester" refers to a structural unit which is formed by the cleavage of the ethylenic double bond of an acrylate ester.

The term "acylate ester" is a generic term that includes acrylate esters having a hydrogen atom bonded to the carbon atom on the α-position, and acrylate esters having a substituent (an atom other than a hydrogen atom or a group) bonded to the carbon atom on the α-position. As the substituent, a lower alkyl group or a halogenated lower alkyl group can be mentioned. With respect to the "structural unit derived from an acrylate ester", the "α-position (the carbon atom on the α-position)" refers to the carbon atom having the carbonyl group bonded thereto, unless specified otherwise. Specific examples of the lower alkyl group for the substituent at the α-position include linear or branched lower alkyl groups such as a methyl group, ethyl group, propyl group, isopropyl group, n-butyl group, isobutyl group, tert-butyl group, pentyl group, isopentyl group, and neopentyl group.

In the present invention, it is preferable that a hydrogen atom, a lower alkyl group or a halogenated lower alkyl group is bonded to the α-position of the acrylate ester, more preferably a hydrogen atom or a lower alkyl group. In terms of industrial availability, a hydrogen atom or a methyl group is particularly desirable.

Structural Unit (a1)

In the present invention, it is preferable that the component (A1) have a structural unit (a1) derived from an acrylate ester containing an acid dissociable, dissolution inhibiting group.

As the acid-dissociable, dissolution-inhibiting group within the structural unit (a1), any of the groups that have been proposed as acid-dissociable, dissolution-inhibiting groups for the base resins of chemically amplified resists can be used, provided the group has an alkali dissolution-inhibiting effect that renders the entire component (A1) insoluble in an alkali developing solution prior to dissociation, and then follow dissociation under action of acid, increases the solubility of the entire component (A1) in the alkali developing solution. Generally, groups that form either a cyclic or chain-like tertiary alkyl ester with the carboxyl group of (meth) acrylic acid or the like, and acetal-type acid dissociable, dissolution inhibiting groups such as alkoxyalkyl groups axe widely known.

Here, a tertiary alkyl ester describes a structure in which an ester is formed by substituting the hydrogen atom of a carboxyl group with a chain-like or cyclic tertiary alkyl group, and a tertiary carbon atom within the chain-like or cyclic tert alkyl group is bonded to the oxygen atom at the terminal of the carbonyloxy group (—C(O)—O—). In this tertiary alkyl ester, the action of acid causes cleavage of the bond between the oxygen atom and the tertiary carbon atom. The chain-like or cyclic alkyl group may have a substituent.

Hereafter, fox the sake of simplicity, groups that exhibit acid dissociability as a result of the formation of a tertiary alkyl ester with a carboxyl group axe referred to as "tertiary alkyl ester-type acid-dissociable, dissolution-inhibiting groups".

Examples of tertiary alkyl ester-type acid dissociable, dissolution inhibiting groups include aliphatic branched, acid dissociable, dissolution inhibiting groups mid aliphatic cyclic group-containing acid dissociable, dissolution inhibiting groups.

In the present description and claims, the term "aliphatic" is a relative concept used in relation to the term "aromatic", and defines a group or compound that has no aromaticity.

The term "aliphatic branched" refers to a branched structure having no aromaticity. The "aliphatic branched, acid dissociable, dissolution inhibiting group" is not limited to be constituted of only carbon atoms and hydrogen atoms (not limited to hydrocarbon groups), but is preferably a hydrocarbon group. Further, the "hydrocarbon group" may be either saturated or unsaturated, but is preferably saturated.

Examples of aliphatic branched, acid dissociable, dissolution inhibiting groups include tertiary allyl groups of 4 to 8 carbon atoms, and specific examples include a tert-butyl group, tert-pentyl group and tert-heptyl group.

The term "aliphatic cyclic group" refers to a monocyclic group or polycyclic group that has no aromaticity.

The "aliphatic cyclic group" within the structural unit (a1) may or may not have a substituent. Examples of substituents include lower alkyl groups of 1 to 5 carbon atoms, fluorine atom, fluorinated lower acyl groups of 1 to 5 carbon atoms, and oxygen atom (=O).

The basic ring of the "aliphatic cyclic group" exclusive of substituents is not limited to be constituted from only carbon and hydrogen (not limited to hydrocarbon groups), but is preferably a hydrocarbon group. Further, the "hydrocarbon group" may be either saturated or unsaturated, but is prefer-ably saturated. Furthermore, the "aliphatic cyclic group" is preferably a polycyclic group.

As such aliphatic cyclic groups, groups in which one or more hydrogen atoms have been removed from a monocycloalkane or a polycycloalkane such as a bicycloalkane, tricycloalkane or tetracycloalkane which may or may not be substituted with a lower alkyl group, a fluorine atom or a fluorinated lower alkyl group, may be exemplified. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane.

As the aliphatic cyclic group-containing acid dissociable, dissolution inhibiting group, for example, a group which has a tertiary carbon atom on the ring structure of the cycloalkyl group can be mentioned. Specific examples include 2-methyl-2-adamantyl group and a 2-ethyl-2-adamantyl group. Further, groups having an aliphatic cyclic group such as an adamantyl group, cyclohexyl group, cyclopentyl group, norbornyl group, tricyclodecanyl group or tetracyclodecanyl group, and a branched alkylene group having a tertiary carbon atom bonded thereto, as in the structural units represented by general formulas (a1"-1) to (a1"-6) shown below, can be exemplified.

[Chemical Formula 6]

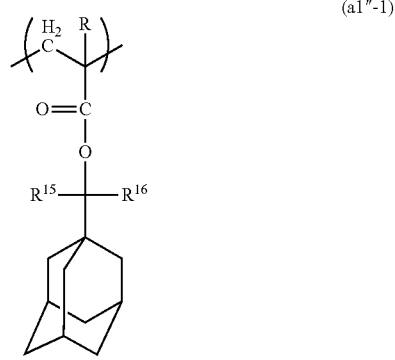

(a1"-1)

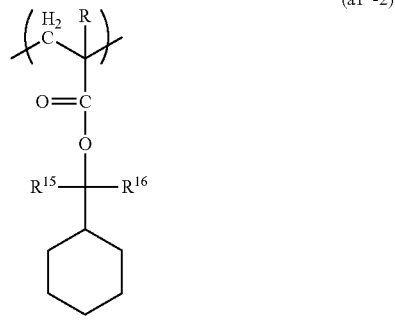

(a1"-2)

-continued (a1″-3)
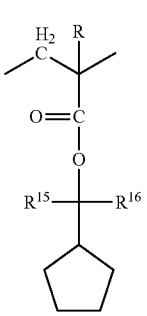

(a1″-4)
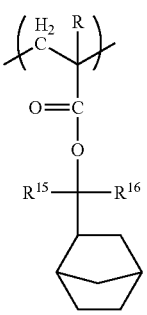

(a1″-5)
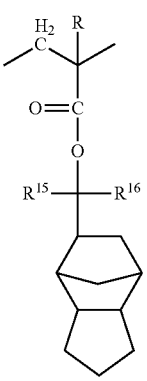

(a1″-6)
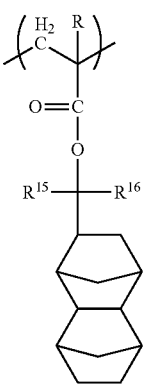

wherein R represents a hydrogen atom, a lower alkyl group or a halogenated lower alkyl group; and $R^{15}$ and $R^{16}$ each independently represents an alkyl group (which may be linear or branched, and preferably has 1 to 5 carbon atoms).

In general formulas (a1″-1) to (a1″-6) above, the lower alkyl group or halogenated lower alkyl group for R are the same as the lower alkyl group or halogenated lower alkyl group which can be bonded to the α-position of the aforementioned acrylate ester.

An "acetal-type acid dissociable, dissolution inhibiting group" generally substitutes a hydrogen atom at the terminal of an alkali-soluble group such as a carboxy group or hydroxyl group, so as to be bonded with an oxygen atom. When acid is generated upon exposure, the generated acid acts to break the bond between the acetal-type acid dissociable, dissolution inhibiting group and the oxygen atom to which the acetal-type, acid dissociable, dissolution inhibiting group is bonded.

Examples of acetal-type acid dissociable, dissolution inhibiting groups include groups represented by general formula (p1) shown below.

[Chemical Formula 7]

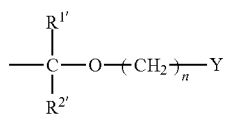

(p1)

wherein $R^{1\prime}$ and $R^{2\prime}$ each independently represents a hydrogen atom or a lower alkyl group; n represents an integer of 0 to 3; and Y represents a lower alkyl group or an aliphatic cyclic group.

In general formula (p1) above, n is preferably an integer of 0 to 2, more preferably 0 or 1, and most preferably 0.

As the lower alkyl group for $R^{1\prime}$ and $R^{2\prime}$, the same as the lower alkyl groups for R above can be exemplified. As the lower alkyl group for $R^{1\prime}$ and $R^{2\prime}$, a methyl group or ethyl group is preferable, and a methyl group is particularly desirable.

In the present invention, it is preferable that at least one of $R^{1\prime}$ and $R^{2\prime}$ be a hydrogen atom. That is, it is preferable that the acid dissociable, dissolution inhibiting group (p1) is a group represent by general formula (p1-1) shoe below.

[Chemical Formula 8]

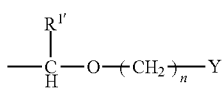

(p1-1)

wherein $R^{1\prime}$, n and Y are as defined above.

As the lower alkyl group for Y, the same as the lower alkyl groups for R above can be exemplified.

As the aliphatic cyclic group for Y, any of the aliphatic monocyclic/polycyclic groups which have been proposed for conventional ArF resists and the like can be appropriately selected for use. For example, the same groups described above in connection with the "aliphatic cyclic group" can be exemplified.

Further, as the acetal-type, acid dissociable, dissolution inhibiting group, groups represented by general formula (p2) shown below can also be exemplified.

[Chemical Formula 9]

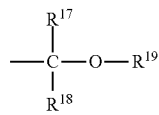

(p2)

wherein $R^{17}$ and $R^{18}$ each independently represents a linear or branched alkyl group or a hydrogen atom; and $R^{19}$ represents a linear, branched or cyclic alkyl group; or $R^{17}$ and $R^{19}$ each independently represents a linear or branched alkylene group, wherein the terminal of $R^{17}$ is bonded to the to of $R^{19}$ to form a ring.

The alkyl group for $R^{37}$ and $R^{18}$ preferably has 1 to 15 carbon atoms, and may be either linear or branched. As the alkyl group, an ethyl group or a methyl group is preferable, and a methyl group is most preferable.

It is particularly desirable that either one of $R^{17}$ and $R^{18}$ be a hydrogen atom, and the other be a methyl group.

$R^{19}$ represents a linear, branched or cyclic alkyl group which preferably has 1 to 15 carbon atoms, and may be any of linear, branched or cyclic.

When $R^{19}$ represents a linear or branched alkyl group, it is preferably an alkyl group of 1 to 5 carbon atoms, more preferably an ethyl group or methyl group, and most preferably an ethyl group.

When $R^{19}$ represents a cycloalkyl group, it preferably has 4 to 15 carbon atoms, more preferably 4 to 12 carbon atoms, and most preferably 5 to 10 carbon atoms. As examples of the cycloalkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be exemplified. Specific examples include groups in which one or more hydrogen atoms have been removed from a monocycloalkane such as cyclopentane or cyclohexane, and groups in which one or more hydrogen atoms have been removed from a polycycloalkane such as adamantane, norbornane, isobornane, tricyclodecane or tetracyclododecane. Of these, a group in which one or more hydrogen atoms have been removed from adamantane is preferable.

In general formula (p2) above, $R^{17}$ and $R^{19}$ may each independently represent a linear or branched alkylene group (preferably an alkylene group of 1 to 5 carbon atoms), and the terminal of $R^{19}$ may be bonded to the terminal of $R^{17}$.

In such a case, a cyclic group is formed by $R^{17}$, $R^{19}$, the oxygen atom having $R^{19}$ bonded thereto and the carbon atom having the oxygen atom and $R^{17}$ bonded thereto. Such a cyclic group is preferably a 4 to 7-membered nag, and more preferably a 4 to 6-membered ring. Specific examples of the cyclic group include tetrahydropyranyl group and tetrahydrofuranyl group.

As the structural unit (a1), it is preferable to use at least one member selected from the group consisting of structural units represented by formula (a1-0-1) shown below and structural units represented by formula (a1-0-2) shown below.

[Chemical Formula 10]

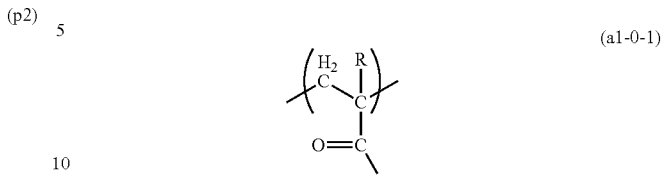

(a1-0-1)

wherein R represents a hydrogen atom, a lower alkyl group or a halogenated lower alkyl group; and $X^1$ represents an acid dissociable, dissolution inhibiting group.

[Chemical Formula 11]

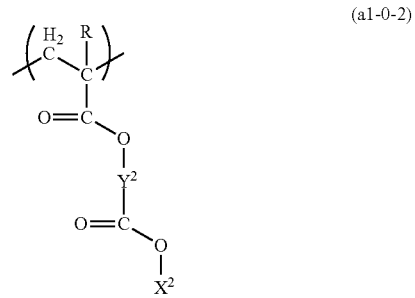

(a1-0-2)

wherein R represents a hydrogen atom, a lower alkyl group or a halogenated lower alkyl group; $X^2$ represents an acid dissociable, dissolution inhibiting group; and $Y^2$ represents at an alkylene group or an aliphatic cyclic group.

In general formula (a1-0-1) shown above, lower alkyl group and halogenated lower alkyl group for R are the same as the lower alkyl group and halogenated lower alkyl group which can be bonded to the α-position of the aforementioned acrylate ester.

$X^1$ is not particularly limited as long as it is an acid dissociable, dissolution inhibiting group. Examples thereof include the aforementioned tertiary alkyl ester-type acid dissociable, dissolution inhibiting groups and acetal-type acid dissociable, dissolution inhibiting groups, and tertiary alkyl ester-type acid dissociable, dissolution inhibiting groups are preferable.

In general formula (a1-0-2), R is as defined above.

$X^2$ is the same as $X^1$ in general formula (a1-0-1).

$Y^2$ is preferably an alkylene group of 1 to 4 carbon atoms or a divalent aliphatic cyclic group. As the aliphatic cyclic group, the same as those exemplified above in connection with the explanation of "aliphatic cyclic group" can be used, except that two hydrogen atoms have been removed therefrom.

Specific examples of the structural unit (a1) include structural units represented by genera formulas (a1-1) to (a1-4) shown below.

[Chemical Formula 12]

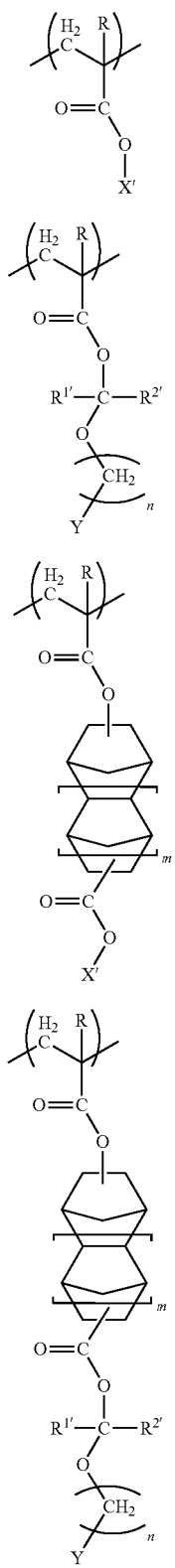

wherein X' represents a tertiary alkyl ester-type acid dissociable, dissolution inhibiting group; Y represents a lower alkyl group of 1 to 5 carbon atoms or an aliphatic cyclic group; n represents an integer of 0 to 3; m represents 0 or 1; R is as defined above; and $R^{1'}$ and $R^{2'}$ each independently represents a hydrogen atom or a lower alkyl group of 1 to 5 carbon atoms.

It is preferable that at least one of $R^{1'}$ and $R^{2'}$ represent a hydrogen atom, and it is more preferable that both of $R^{1'}$ and $R^{2'}$ represent a hydrogen atom n is preferably 0 or 1.

Examples of the tertiary alkyl ester-type acid dissociable, dissolution inhibiting group for X' are the same as the above-exemplified tertiary alkyl ester-type acid dissociable, dissolution inhibiting groups for $X^1$.

Examples of the aliphatic cyclic group for Y are the same as those exemplified above in connection with the explanation of "aliphatic cyclic group".

Specific examples of structural units represented by general formula (a1-1) to (a1-4) are shown below.

[Chemical Formula 13]

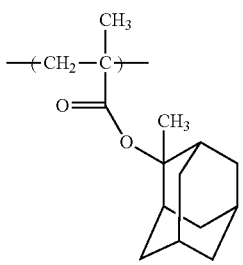 (a1-1-1)

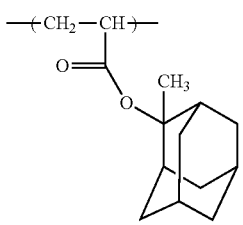 (a1-1-2)

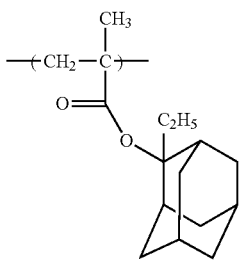 (a1-1-3)

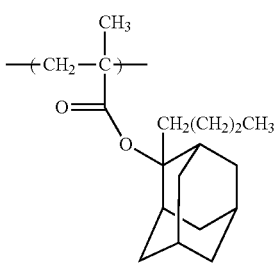 (a1-1-4)

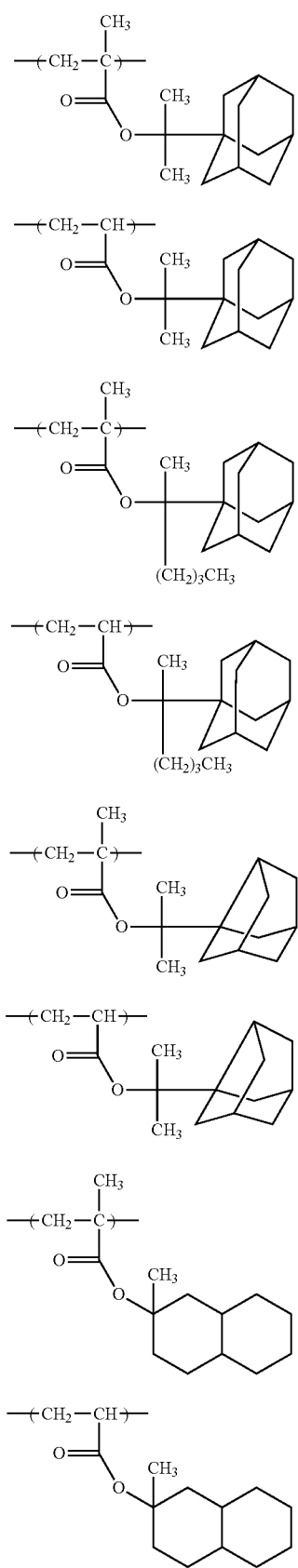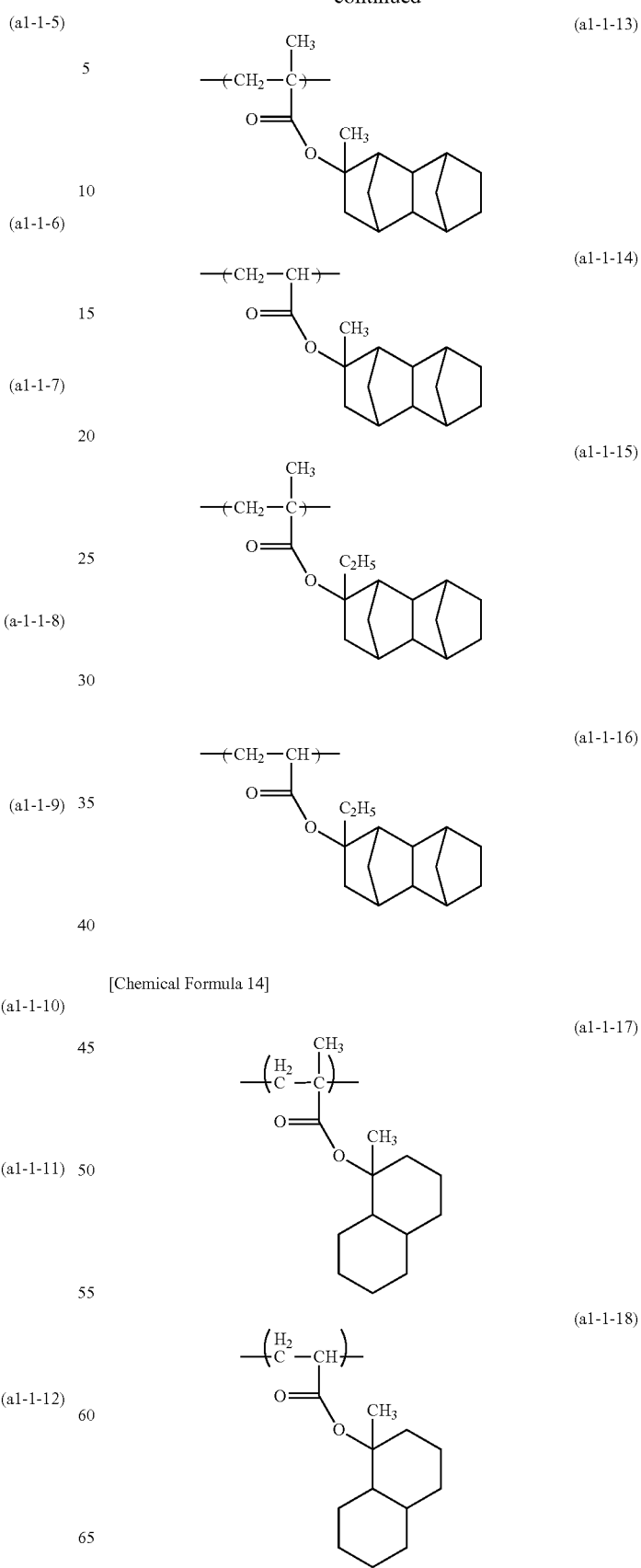

-continued
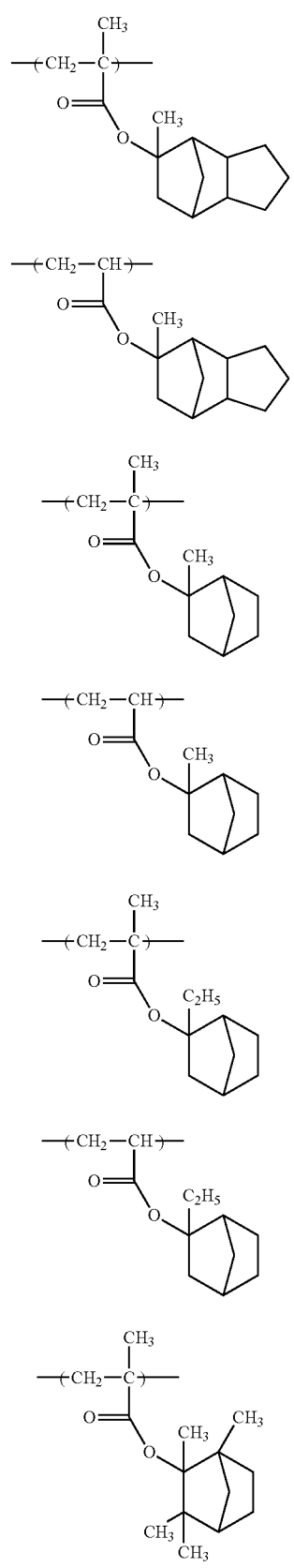
(a1-1-19)
(a1-1-20)
(a1-1-21)
(a1-1-22)
(a1-1-23)
(a1-1-24)
(a1-1-25)
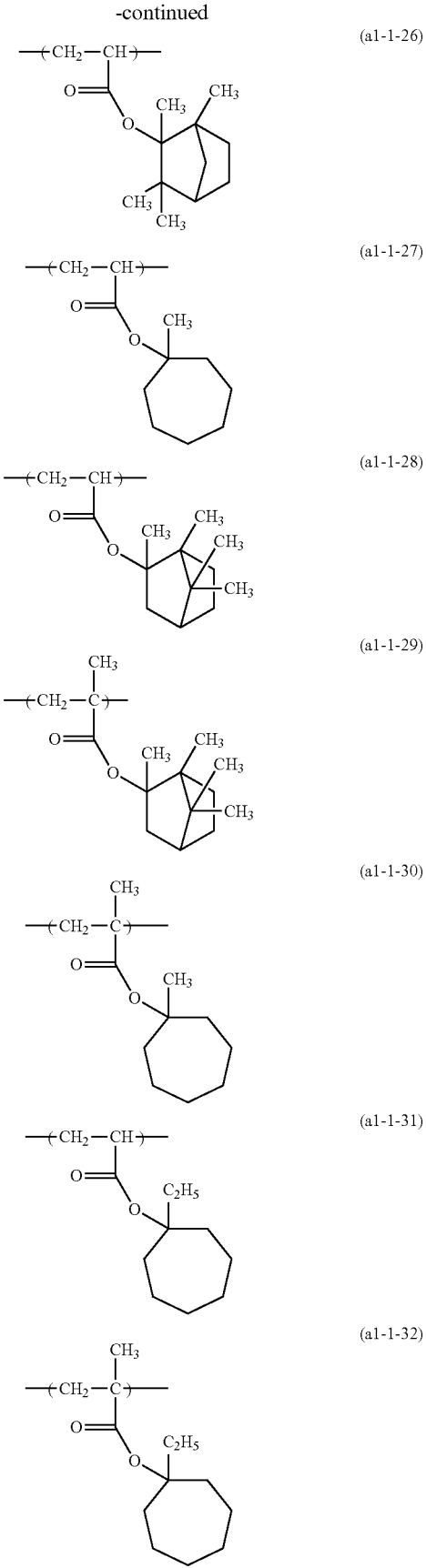
(a1-1-26)
(a1-1-27)
(a1-1-28)
(a1-1-29)
(a1-1-30)
(a1-1-31)
(a1-1-32)

[Chemical Formula 15]
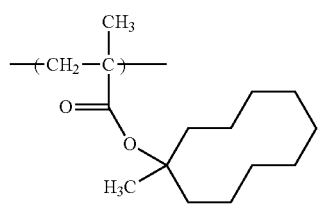 (a1-1-33)
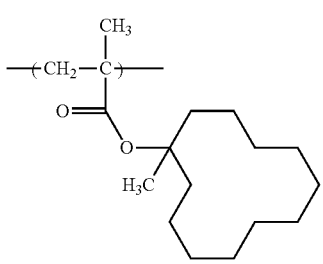 (a1-1-34)
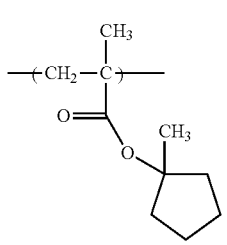 (a1-1-35)
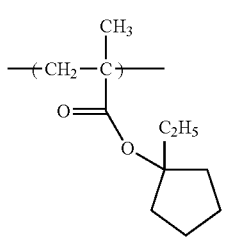 (a1-1-36)
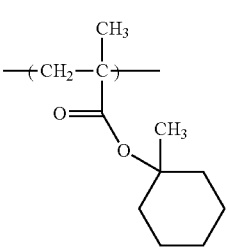 (a1-1-37)
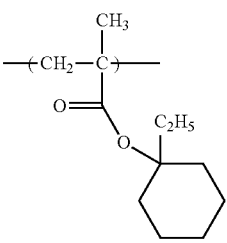 (a1-1-38)
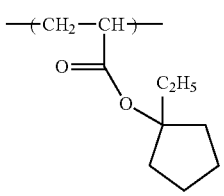 (a1-1-39)
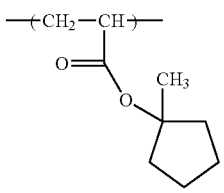 (a1-1-40)
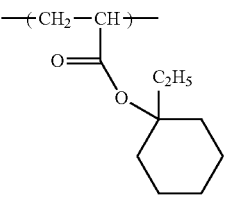 (a1-1-41)
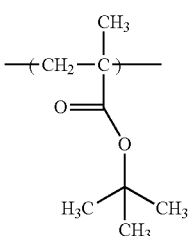 (a1-1-42)
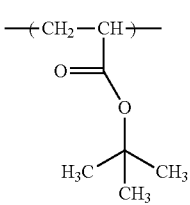 (a1-1-43)
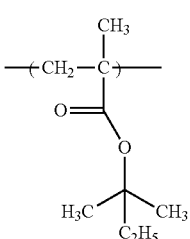 (a1-1-44)
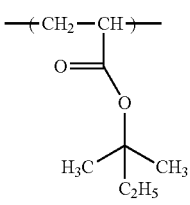 (a1-1-45)

-continued
[Chemical Formula 16]
(a1-2-1) 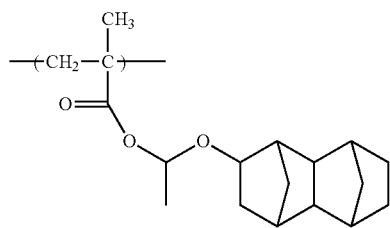
(a1-2-2) 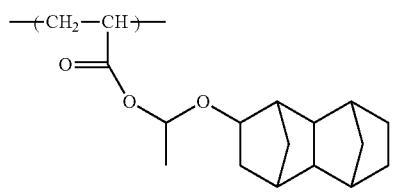
(a1-2-3) 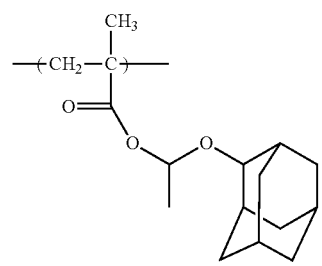
(a1-2-4) 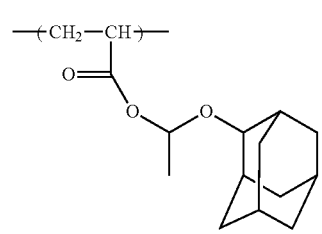
(a1-2-5) 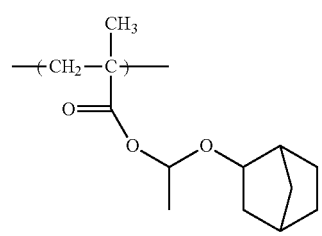
(a1-2-6) 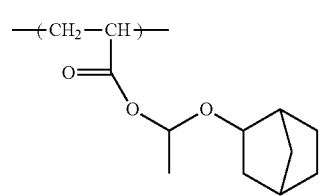
-continued
[Chemical Formula 17]
(a1-2-7) 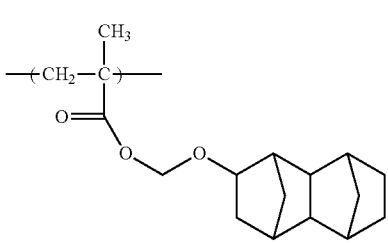
(a1-2-8) 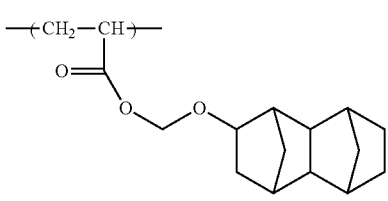
(a1-2-9) 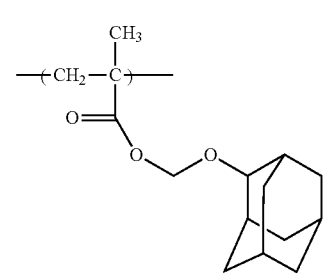
(a1-2-10) 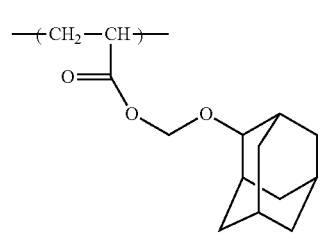
(a1-2-11) 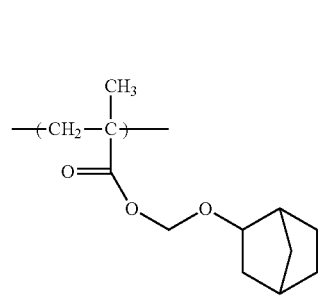
(a1-2-12) 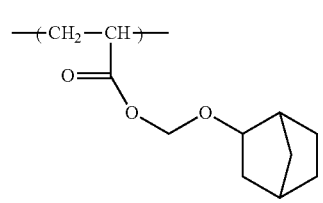

-continued
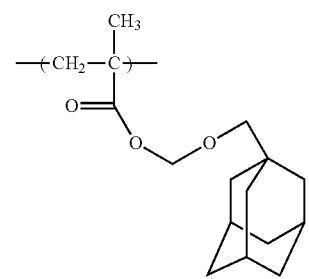
(a1-2-13)
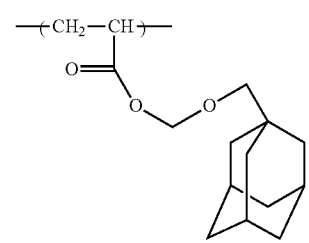
(a1-2-14)
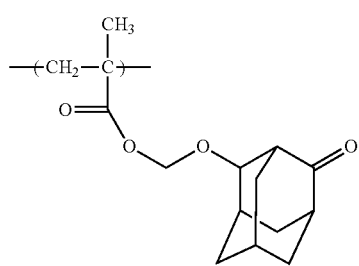
(a1-2-15)
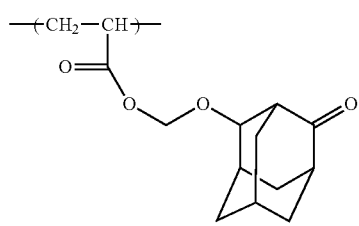
(a1-2-16)
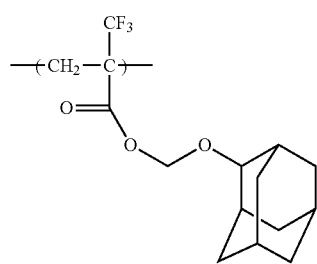
(a1-2-17)
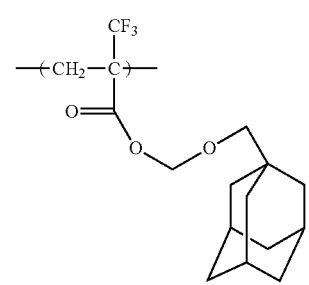
(a1-2-18)
-continued
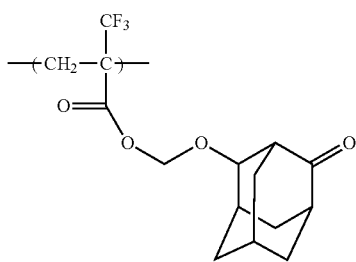
(a1-2-19)
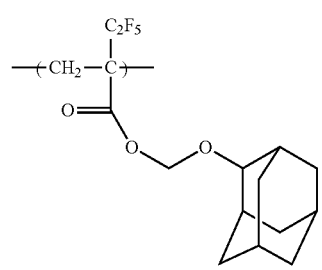
(a1-2-20)
[Chemical Formula 18]
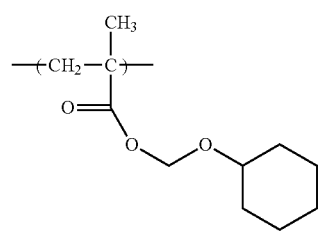
(a1-2-21)
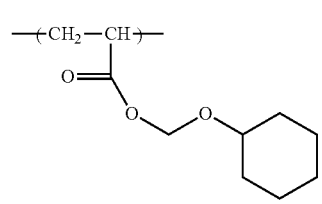
(a1-2-22)
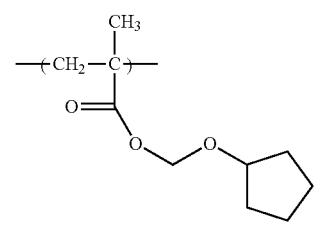
(a1-2-23)
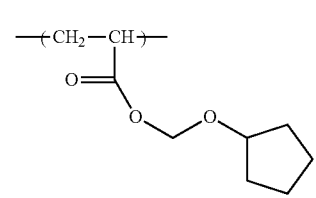
(a1-2-24)

-continued
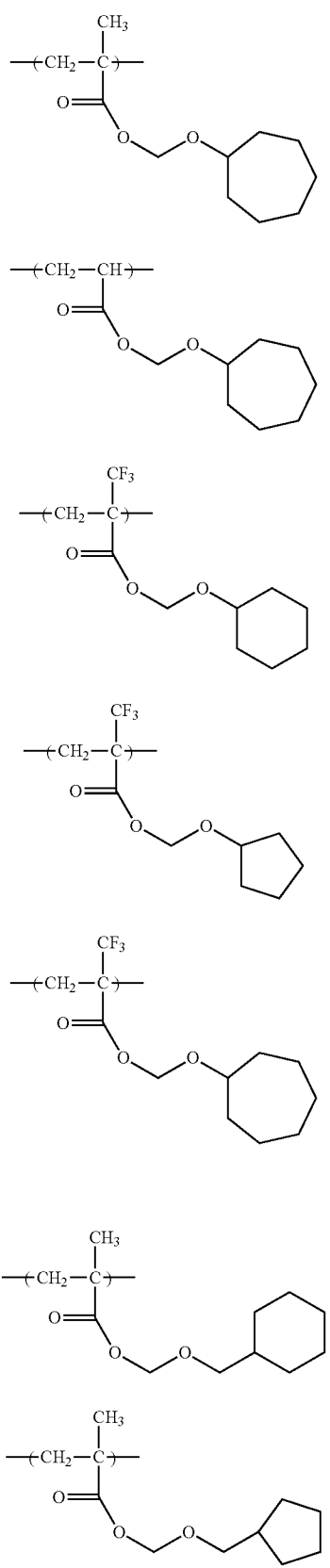
(a1-2-25)
(a1-2-26)
(a1-2-27)
(a1-2-28)
(a1-2-29)
(a1-2-30)
(a1-2-31)
[Chemical Formula 19]
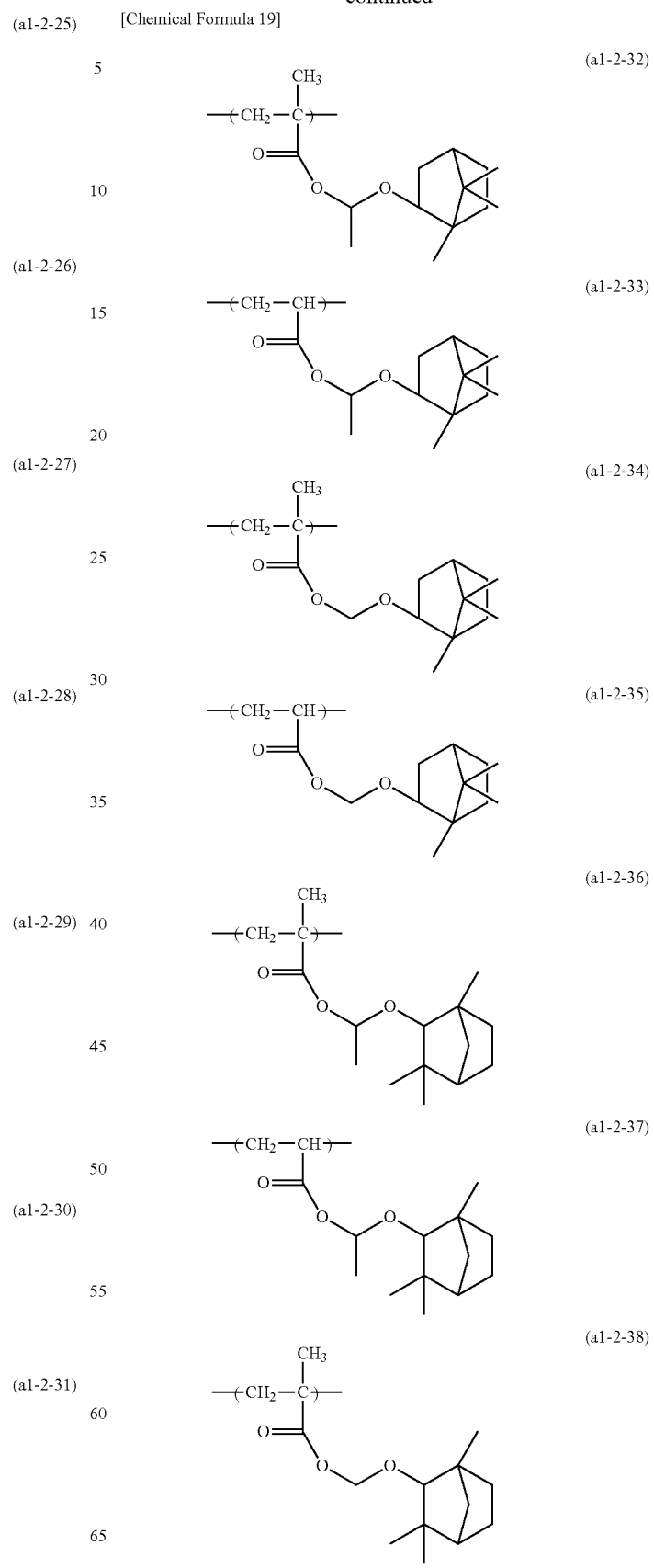
(a1-2-32)
(a1-2-33)
(a1-2-34)
(a1-2-35)
(a1-2-36)
(a1-2-37)
(a1-2-38)

-continued
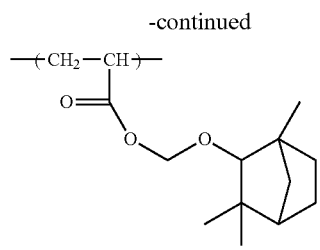
(a1-2-39)
[Chemical Formula 20]
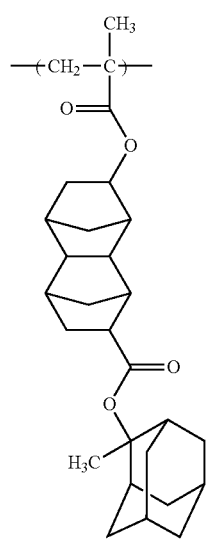
(a1-3-1)
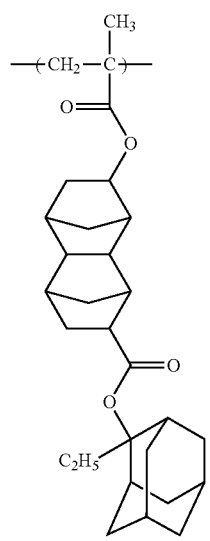
(a1-3-2)
-continued
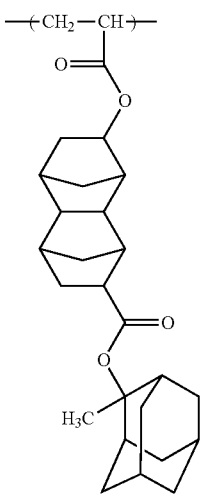
(a1-3-3)
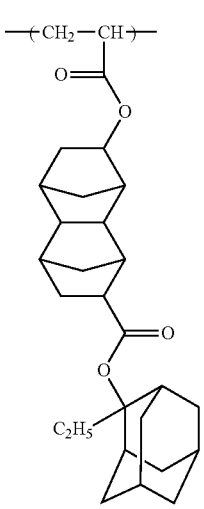
(a1-3-4)
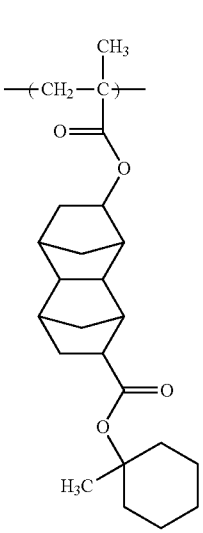
(a1-3-5)

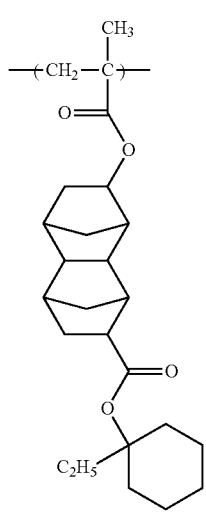
(a1-3-6)
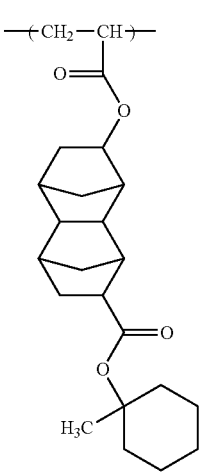
(a1-3-9)
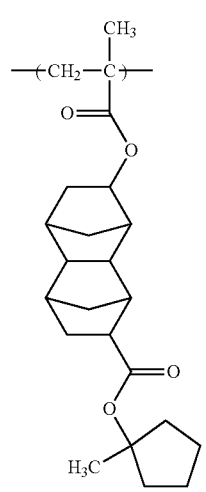
(a1-3-7)
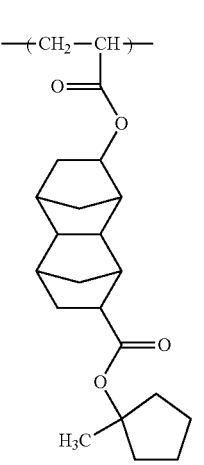
(a1-3-10)
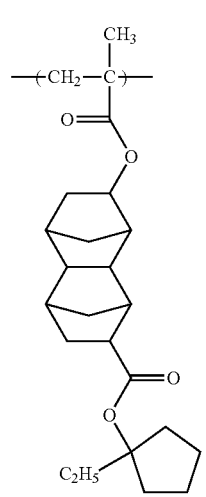
(a1-3-8)
(a1-3-11)

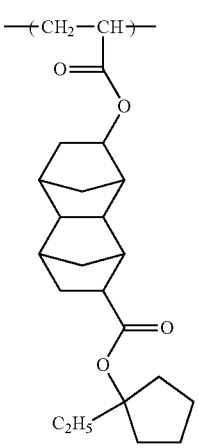
(a1-3-12)
[Chemical Formula 21]
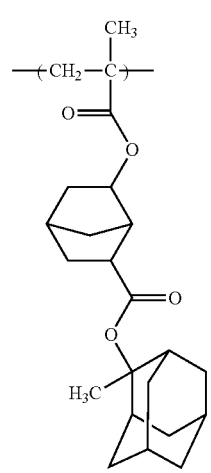
(a1-3-13)
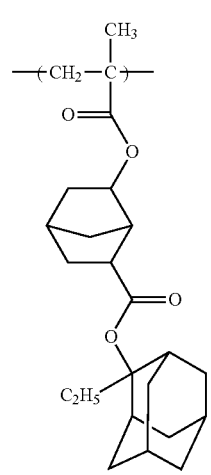
(a1-3-14)
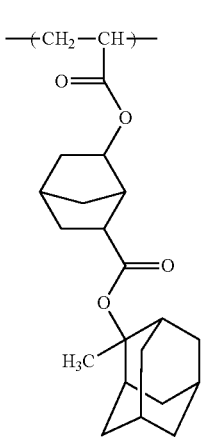
(a1-3-15)
(a1-3-16)
(a1-3-17)

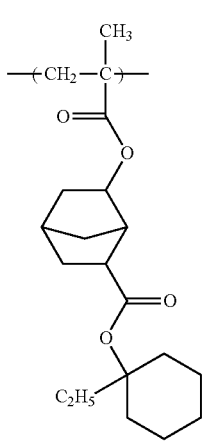 (a1-3-18)
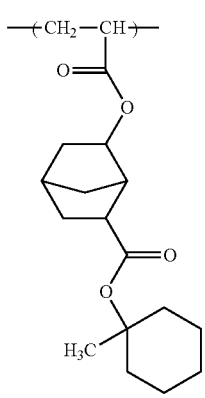 (a1-3-19)
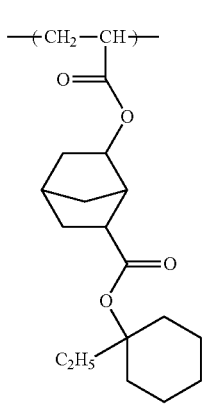 (a1-3-20)
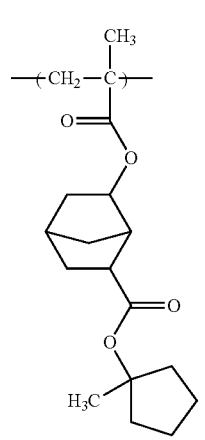 (a1-3-21)
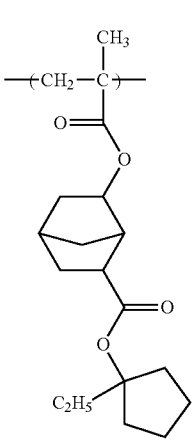 (a1-3-22)
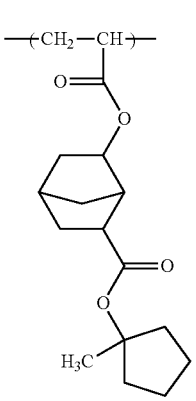 (a1-3-23)
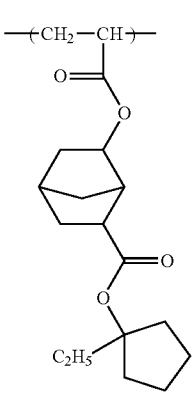 (a1-3-24)

-continued
[Chemical Formula 22]
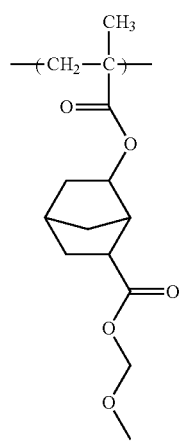 (a1-4-1)
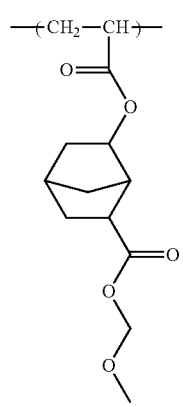 (a1-4-2)
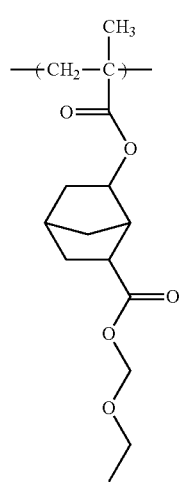 (a1-4-3)
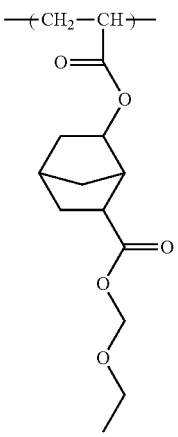 (a1-4-4)
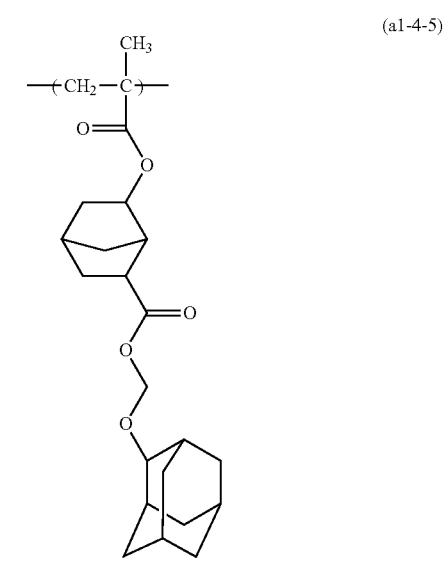 (a1-4-5)
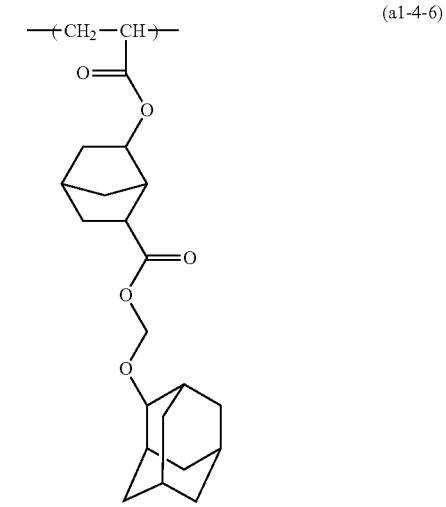 (a1-4-6)

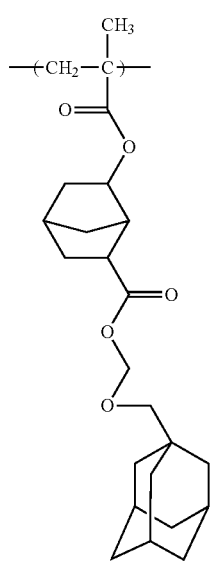
(a1-4-7)
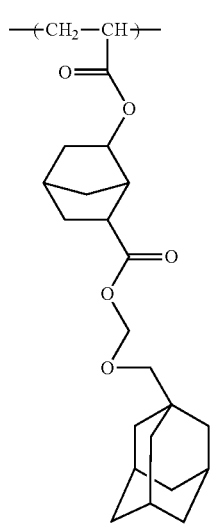
(a1-4-8)
(a1-4-9)
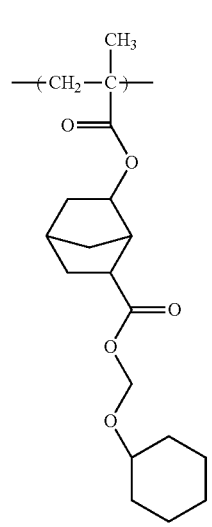
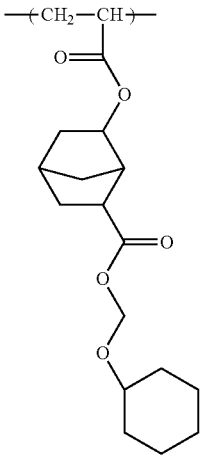
(a1-4-10)
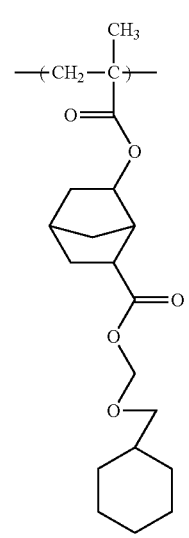
(a1-4-11)
(a1-4-12)
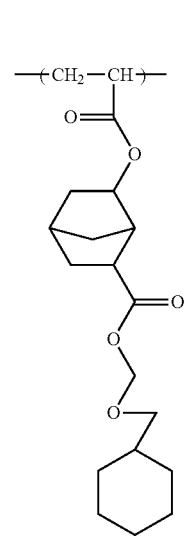

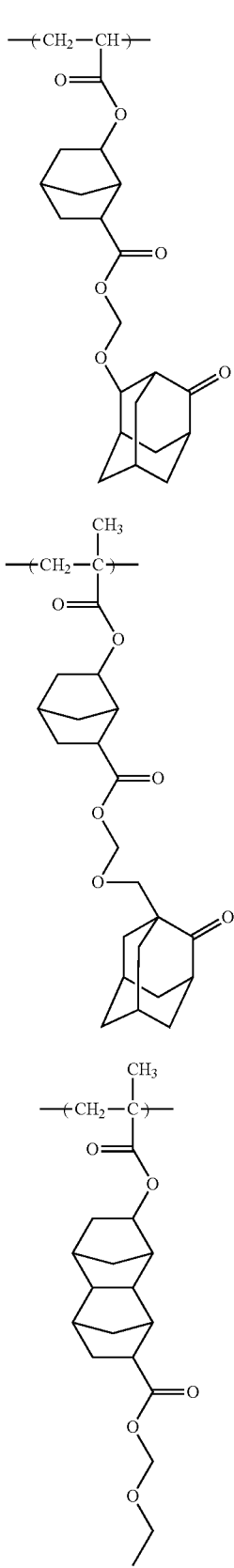
(a1-4-13)
(a1-4-14)
(a1-4-15)
[Chemical Formula 23]
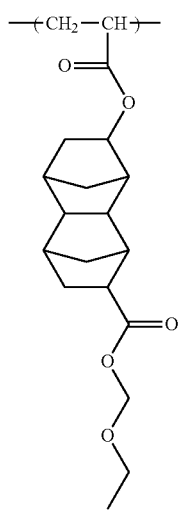
(a1-4-16)
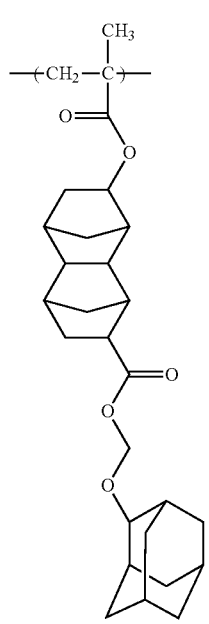
(a1-4-17)

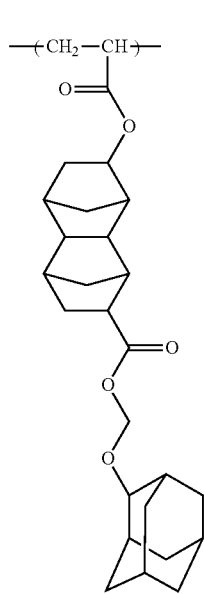
(a1-4-18)
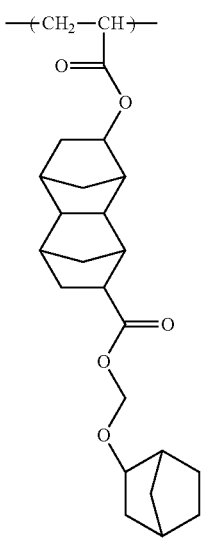
(a1-4-20)
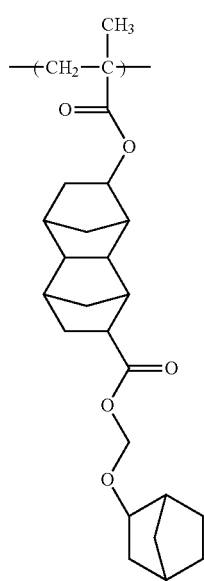
(a1-4-19)
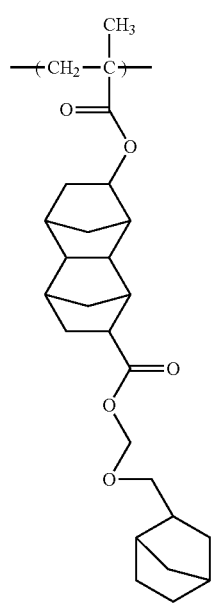
(a1-4-21)

(a1-4-22)
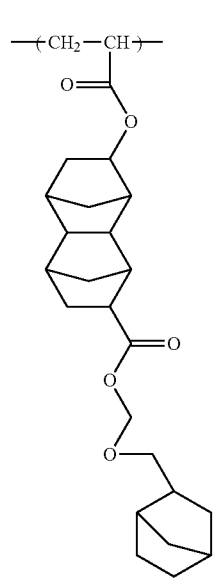
(a1-4-24)
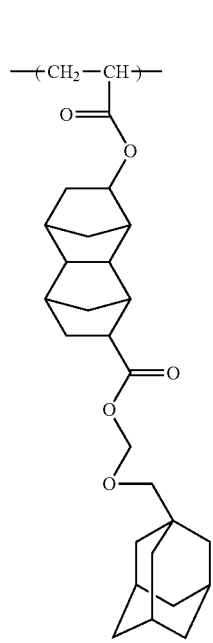
(a1-4-23)
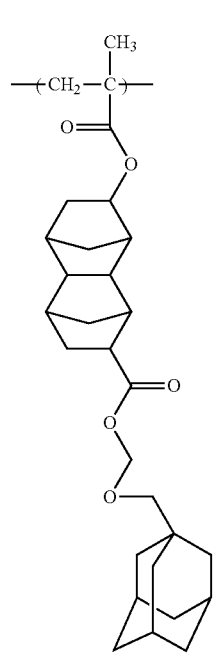
(a1-4-25)
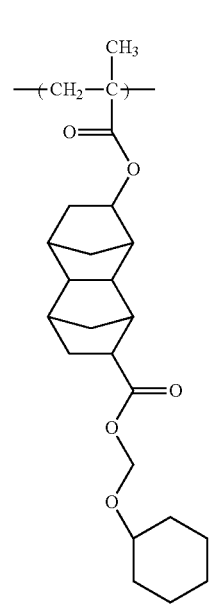

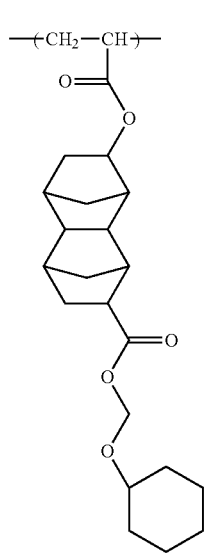
(a1-4-26)
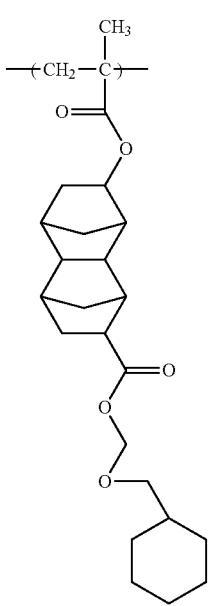
(a1-4-27)
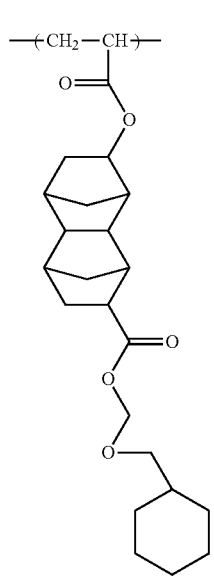
(a1-4-28)
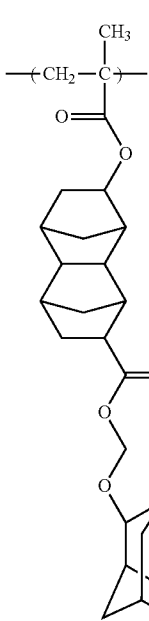
(a1-4-29)

-continued

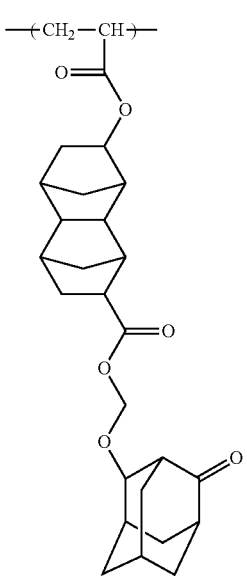
(a1-4-30)

As the structural unit (a1), one type may be used alone, or two or more types may be used in combination.

Among these, structural units represented by general formula (a1-1) arm preferable. More specifically, at least one structural unit selected from the group consist of structural units represented by formulas (a1-1-1) to (a1-1-6) and (a1-1-35) to (a1-1-41) is more preferable.

Further, as the structural unit (a1), structural units represented by general formula (a1-1-01) shown below which includes the structural units represented by formulas (a1-1-1) to (a1-1-4), and structural units represented by general formula (a1-1-02) shown below which includes the structural units represented by formulas (a1-1-35) to (a1-1-41) are also preferable.

[Chemical Formula 24]

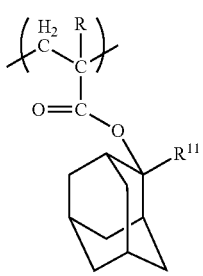
(a1-1-01)

wherein R represents a hydrogen atom, a lower alkyl group or a halogenated lower alkyl group; and $R^{11}$ represent a lower alkyl group.

[Chemical Formula 25]

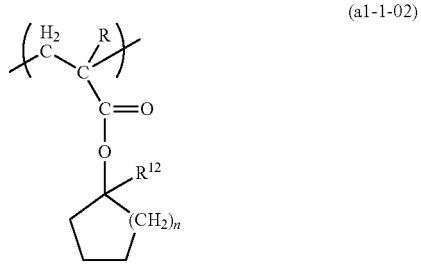
(a1-1-02)

wherein R represents a hydrogen atom, a lower alkyl group or a halogenated lower alkyl group; $R^{12}$ represents a lower alkyl group; and h represents an integer of 1 to 3.

In general formula (a1-1-01), R is as defined above. The lower alkyl group for $R^{11}$ is the same as the lower alkyl group for R above, and is preferably a methyl group or an ethyl group.

In general formula (a1-1-02), R is as defined above. The lower alkyl group for $R^{11}$ is the same as the lower alkyl group for R above. $R^{12}$ is preferably a methyl group or an ethyl group, and most preferably an ethyl group. h is preferably 1 or 2, and most preferably 2.

In the component (A1), the amount of the structural unit (a1) based on the combined total of all structural units constituting the component (A1) is preferably 10 to 80 mol %, more preferably 20 to 70 mol %, and still more preferably 25 to 50 mol %. By making the amount of the structural unit (a1) at least as large as the lower limit of the above-mentioned range, a pattern can be easily formed using a resist composition prepared from the component (A1). On the other hand, by making the amount of the structural unit (a1) no more then the upper limit of the above-mentioned range, a good balance can be achieved with the other structural units.

Structural Unit (a2)

In the present invention, the component (A1) preferably has a structural unit (a2) derived from au acrylate ester containing a lactone-containing cyclic group, as well as the structural unit (a1).

The term "lactone-containing cyclic group" refers to a cyclic group including one ring containing a —O—C(O)— structure (lactone ring). The term "lactone ring" refers to a single ring coning a O—C(O)— structure, and this ring is counted as the first ring. A lactone-containing cyclic group in which the only ring structure is the lactone ring is referred to as a monocyclic group, and groups containing other ring structures are described as polycyclic groups regardless of the structure of the other rings.

When the component (A1) is used for forming a resist film, the lactone-containing cyclic group of the structural unit (a2) is effective in improving the adhesion between the resist film and the substrate, and increasing the compatibility with the developing solution containing water.

As the structural unit (a2), there is no particular limitation, and an arbitrary structural unit may be used.

Specific examples of lactone-containing monocyclic groups include groups in which one hydrogen atom has been removed from γ-butyrolactone. Further, specific examples of lactone-containing polycyclic groups include groups in which one hydrogen atom has been removed from a lactone ring-containing bicycloalkane, tricycloalkane or tetracycloalkane.

More specifically, examples of the structural unit (a2) include structural units represented by general formulas (a2-1) to (a2-5) shown below.

[Chemical Formula 26]

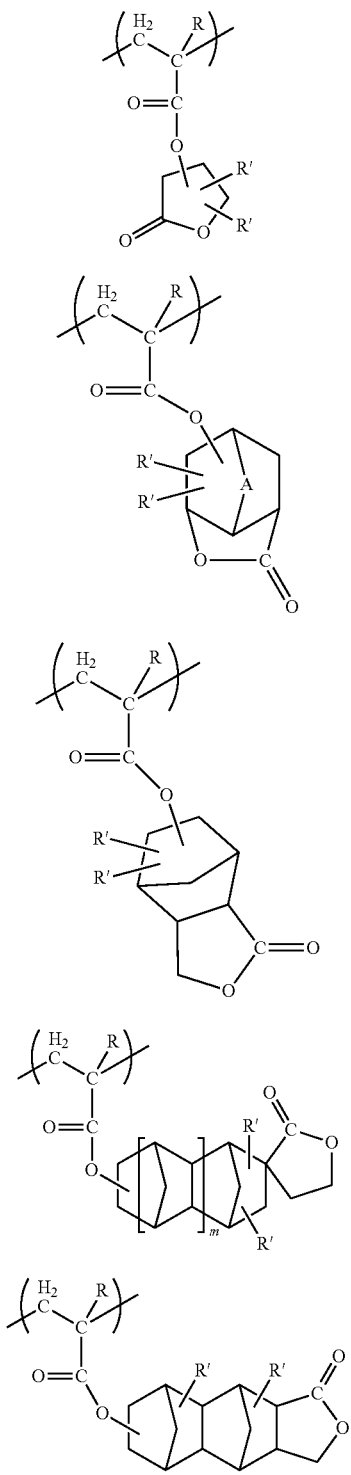

wherein k represents a hydrogen atom, a lower alkyl group or a halogenated lower alkyl group; R' represents a hydrogen atom a lower alkyl group or an alkoxy group of 1 to 5 carbon atoms; m represents 0 or 1; and A represents an alkylene group of 1 to 5 carbon atoms or an oxygen atom.

In general formulas (a2-1) to (a2-5), R is the same as R in the structural unit (a1).

The lower alkyl group for R' is the same as the lower alkyl group for R in the structural unit (a1).

Specific examples of alkylene groups of 1 to 5 carbon atoms for A include a methylene group, ethylene group, n-propylene group and isopropylene group.

In the structural units represented by general formulas (a2-1) to (a2-5), in consideration of industrial availability, R' is preferably a hydrogen atom.

Specific examples of structural units represented by general formulas (a2-1) to (a2-5) above are shown below.

[Chemical Formula 27]

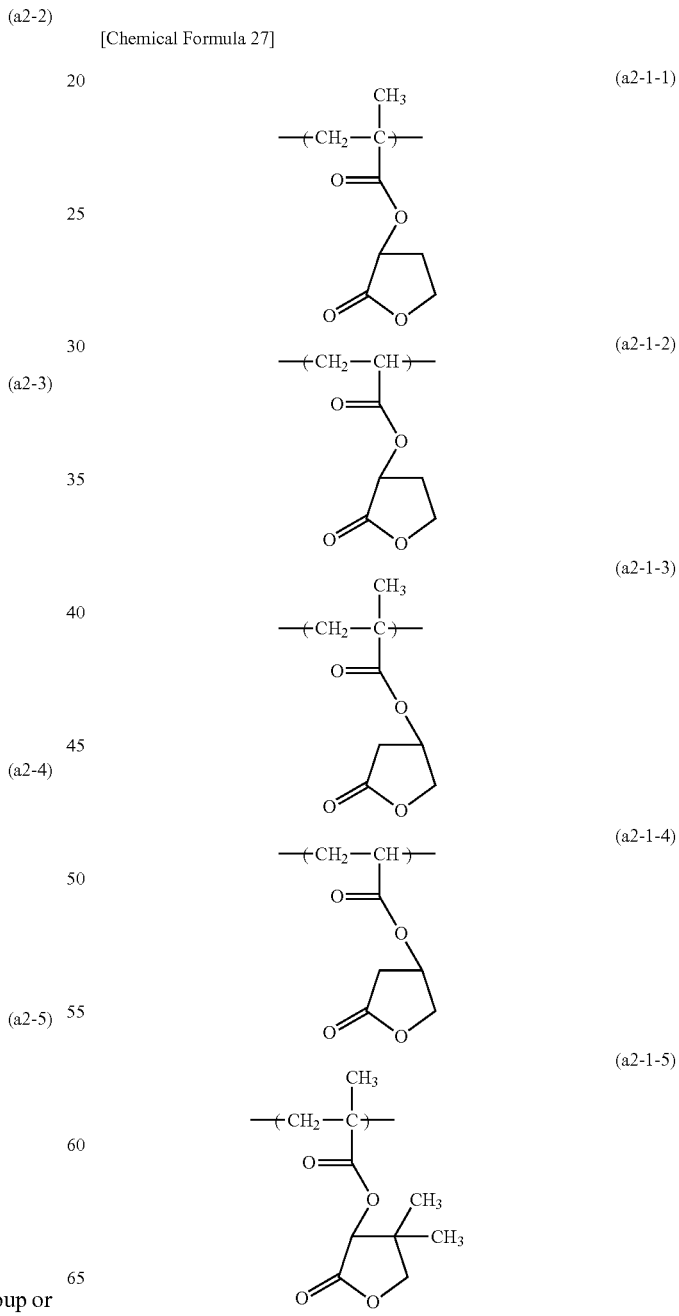

-continued
(a2-1-6)
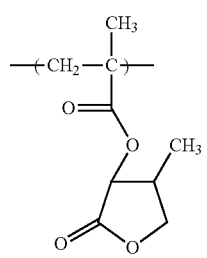
[Chemical Formula 28]
(a2-2-1)
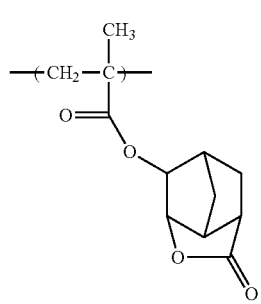
(a2-2-2)
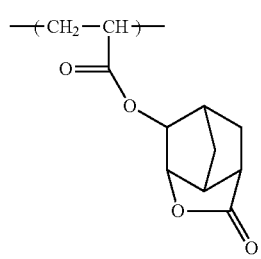
(a2-2-3)
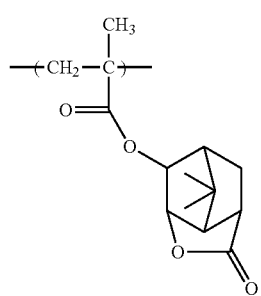
(a2-2-4)
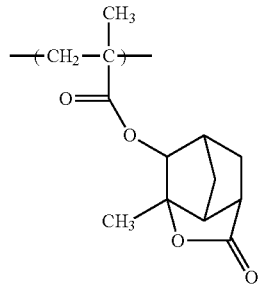
-continued
(a2-2-5)
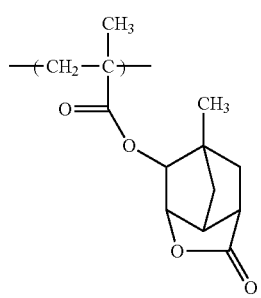
(a2-2-6)
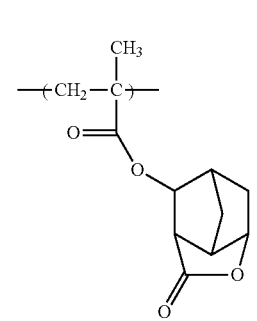
(a2-2-7)
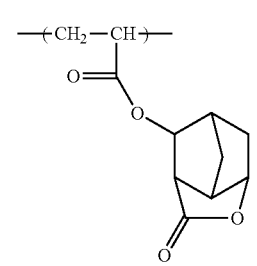
(a2-2-8)
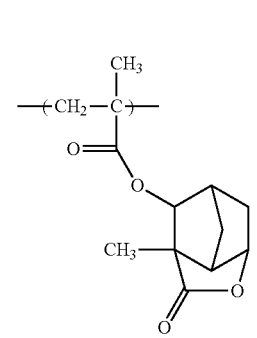
(a2-2-9)
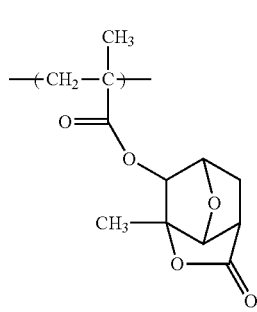

-continued
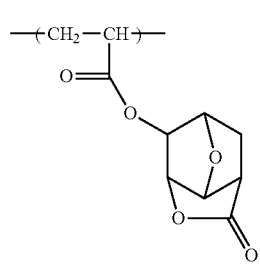 (a2-2-10)
[Chemical Formula 29]
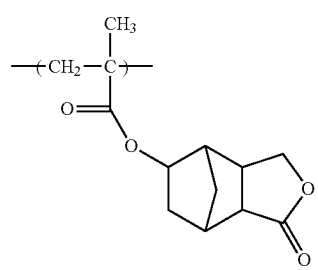 (a2-3-1)
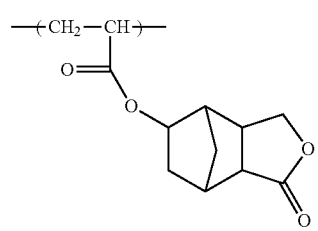 (a2-3-2)
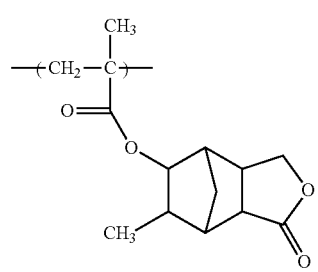 (a2-3-3)
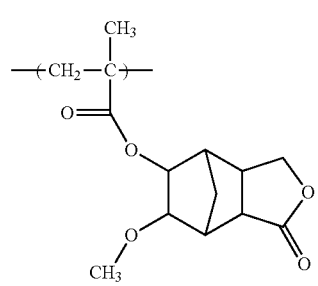 (a2-3-4)
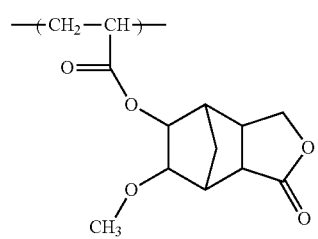 (a2-3-5)
-continued
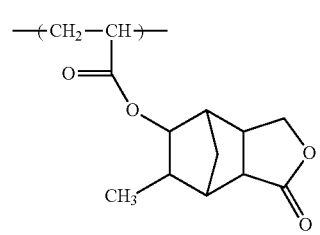 (a2-3-6)
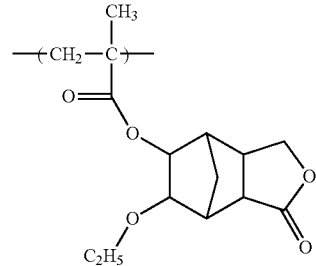 (a2-3-7)
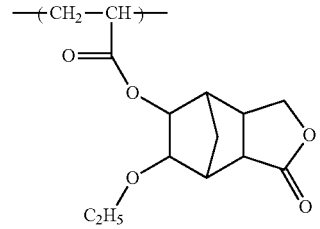 (a2-3-8)
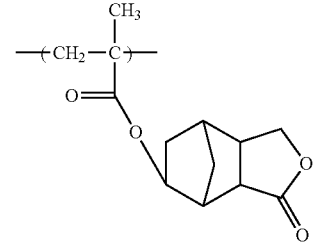 (a2-3-9)
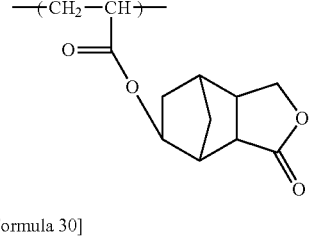 (a2-3-10)
[Chemical Formula 30]
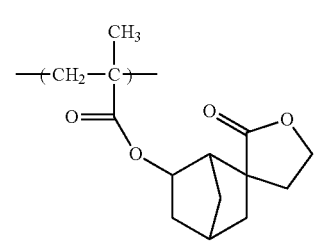 (a2-4-1)

-continued
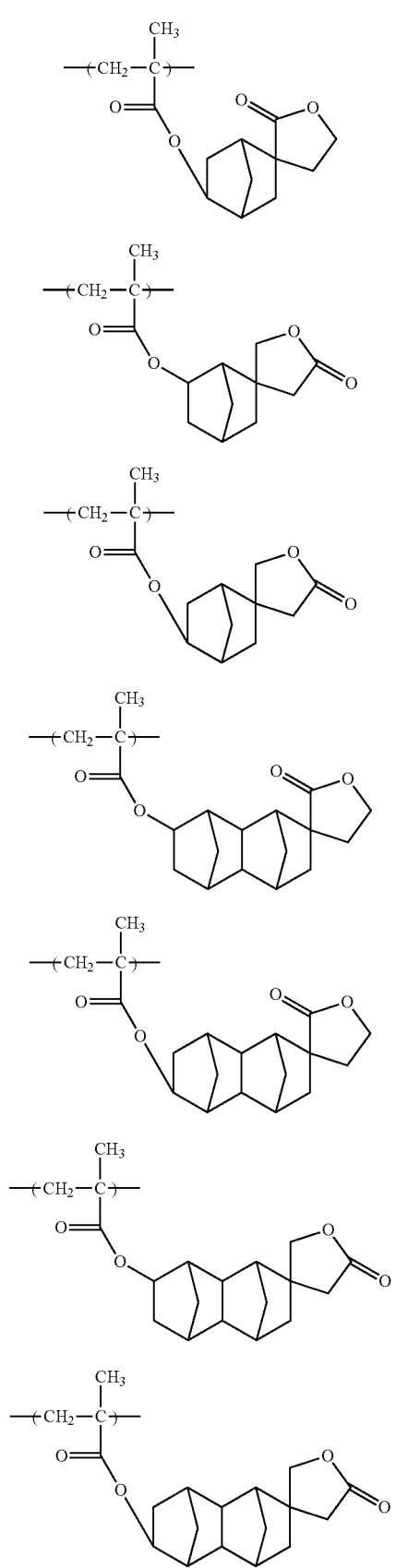
(a2-4-2)
(a2-4-3)
(a2-4-4)
(a2-4-5)
(a2-4-6)
(a2-4-7)
(a2-4-8)
-continued
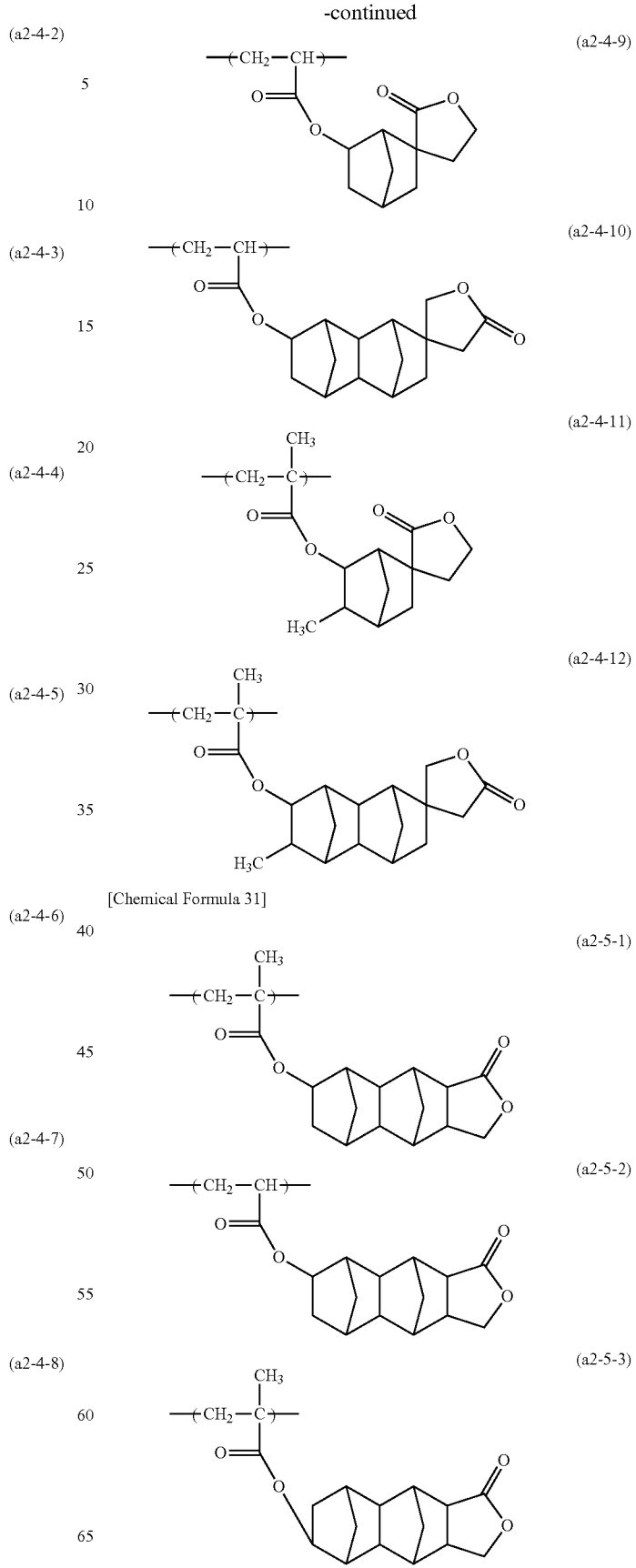
(a2-4-9)
(a2-4-10)
(a2-4-11)
(a2-4-12)
[Chemical Formula 31]
(a2-5-1)
(a2-5-2)
(a2-5-3)

-continued

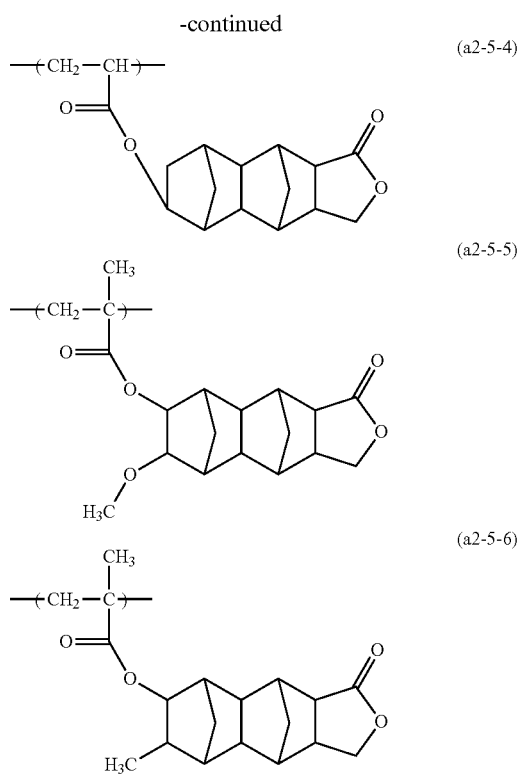

(a2-5-4)

(a2-5-5)

(a2-5-6)

In the component (A1), as the structural unit (a2), one type of structural unit may be used, or two or more types may be used in combination.

Of these, at least one structural unit selected from the group consisting of formulas (a2-1) to (a2-5) is preferable, and at least one structural unit selected from the group consist of formulas (a2-1) to (a2-3) is more preferable. Specifically, it is preferable to use at least one structural unit selected from the group consisting of formulas (a2-1-1), (a2-1-2), (a2-2-1), (a2-2-2), (a2-3-1), (a2-3-2), (a2-3-9) and (a2-3-10).

In the component (A1), the amount of the structural unit (a2) based on the combined total of all structural units constituting the component (A1) is preferably 5 to 60 mol %, more preferably 10 to 50 mol %, and still more preferably 20 to 50 mol %. By making the amount of the structural unit (a2) at least as large as the lower limit of the above-mentioned rage, the effect of using the structural unit (a2) can be satisfactorily achieved. On the other hand, by making the amount of the structural unit (a2) no more than the upper limit of the above-mentioned range, a good balance can be achieved with the other structural units.

Structural Unit (a3)

The component (A1) preferably has a structural unit (a3) derived from an acrylate ester having a polar group-containing aliphatic hydrocarbon group, as well as the structural unit (a1) and the structural unit (a2). By including the structural unit (a3), the hydrophilicity of the component (A1) is improved, and hence, the compatibility of the component (A1) with the developing solution is improved. As a result, the solubility of the exposed portions in an alkali developing solution improves, which contributes to favorable improvements in the resolution.

Examples of the polar group include a hydroxyl group, cyano group, carboxyl group, or hydroxyalkyl group in which some of the hydrogen atoms of the alkyl group have been substituted with fluorine atoms, although a hydroxyl group is particularly desirable.

Examples of the aliphatic hydrocarbon group include linear or branched hydrocarbon groups (and preferably alkylene groups) of 1 to 10 carbon atoms, and polycyclic aliphatic hydrocarbon groups (polycyclic groups). These polycyclic groups can be selected appropriately from the multitude of groups that have been proposed for the resins of resist compositions designed for use with ArF excimer lasers. The polycyclic group preferably has 7 to 30 carbon atoms.

Of the various possibilities, structural units derived from an acrylate ester that include an aliphatic polycyclic group that contains a hydroxyl group, cyano group, carboxyl group or a hydroxyalkyl group in which some of the hydrogen atoms of the alkyl group have been substituted with fluorine atoms are particularly desirable. Examples of polycyclic groups include groups in which two or more hydrogen atoms have been removed from a bicycloalkane, tricycloalkane, tetracycloalkane or the like. Specific examples include groups in which two or more hydrogen atoms have been removed from a polycycloalkane such as adamantane, norbornane, isobornane, tricyclodecane or tetracyclododecane. Of these polycyclic groups, grows in which two or more hydrogen atoms have been removed from adamantane, norbornane or tetracyclododecane are preferred industrially.

When the aliphatic hydrocarbon group within the polar group-containing aliphatic hydrocarbon group is a linear or branched hydrocarbon group of 1 to 10 carbon atoms, the structural unit (a3) is preferably a structural unit derived from a hydroxyethyl ester of acrylic acid. On the other hand, when the hydrocarbon group is a polycyclic group, structural units represented by formulas (a3-1), (a3-2), and (a3-3) shown below are preferable.

[Chemical Formula 32]

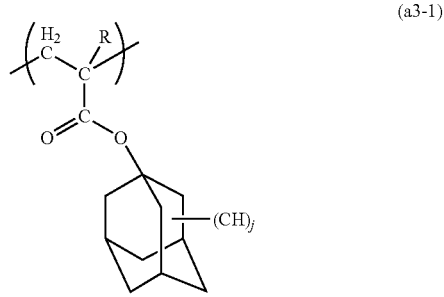

(a3-1)

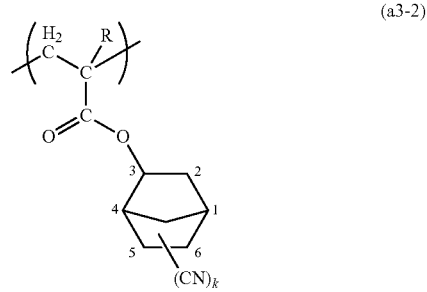

(a3-2)

-continued

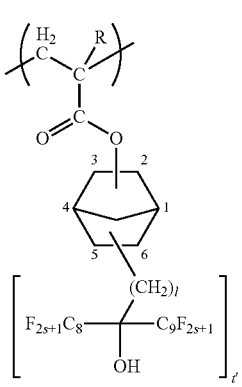
(a3-3)

wherein R is as defined above; j is an integer of 1 to 3; k is an integer of 1 to 3; t' is an integer of 1 to 3; l is an integer of 1 to 5; and s is an integer of 1 to 3.

In formula (a3-1), j is preferably 1 or 2, and more preferably 1. When j is 2, it is preferable that the hydroxyl groups be bonded to the 3rd and 5th positions of the adamantyl group. When j is 1, it is preferable that the hydroxyl group be bonded to the 3rd position of the adamantyl group.

j is preferably 1, and it is particularly desirable that the hydroxyl group be bonded to the 3rd position of the adamantyl group.

In formula (a3-2), k is preferably 1. The cyano group is preferably bonded to the 5th or 6th position of the norbornyl group.

In formula (a3-3), t' is preferably 1, l is preferably 1 and s is preferably 1. Further, in formula (a3-3), it is preferable that a 2-norbornyl group or 3-norbornyl group be bonded to the terminal of the carboxy group of the acrylic acid. The fluorinated alkyl alcohol is preferably bonded to the 5th or 6th position of the norbornyl group.

In the component (A1), as the structural unit (a3), one type of structural unit may be used, or two or more types may be used in combination.

When the component (A1) contains the structural unit (a3), the amount of structural unit (a3) based on the combined total of all structural units constituting the component (A1) is preferably 5 to 50 mol %, more preferably 5 to 40 mol %, and still more preferably 5 to 25 mol %.

Structural Unit (a4)

The component (A1) may also have a structural unit (a4) which is other than the above-mentioned structural units (a1) to (a3), as long as the effects of the present invention are not impaired.

As the structural unit (a4), any other structural unit which cannot be classified as one of the above structural units (a1) to (a3) can be used without any particular limitations, and any of the multitude of conventional structural units used within resist resins for AF excimer lasers or KrF excimer lasers (and particularly for ArF excimer lasers) can be used.

As the structural unit (a4), a structural unit which contains a non-acid-dissociable aliphatic polycyclic group, and is also derived from an acrylate ester is preferable. Examples of this polycyclic group include the same groups as those described above in connection with the aforementioned structural unit (a1), and any of the multitude of conventional polycyclic groups used within the resin component of resist compositions for ArF excimer lasers or KrF excimer lasers (and particularly for ArF excimer lasers) can be used.

In consideration of industrial availability and the like, at least one polycyclic group selected from amongst a tricyclodecanyl group, adamantyl group, tetracyclododecanyl group, isobornyl group, and norbornyl group is particularly desirable. These polycyclic groups may be substituted with a linear or branched alkyl group of 1 to 5 carbon atoms.

Specific examples of the structural unit (a4) include units with sutures represented by general formulas (a4-1) to (a4-5) shown below.

[Chemical Formula 33]

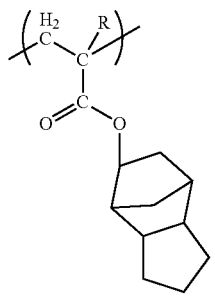
(a4-1)

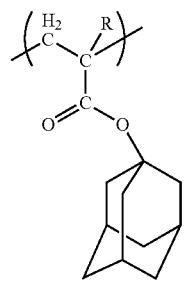
(a4-2)

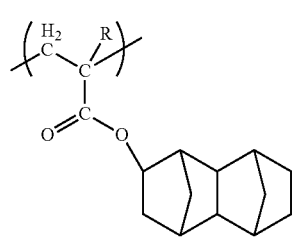
(a4-3)

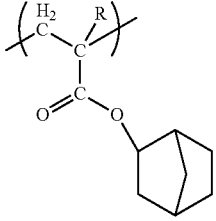
(a4-4)

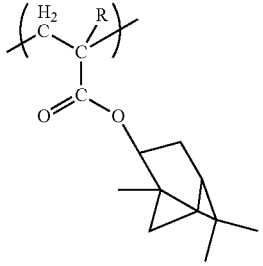
(a4-5)

wherein R is as defined above.

When the structural unit (a4) is included in the component (A1), the amount of the structural unit (a4) based on the combined total of all the structural units that constitute the component (A1) is preferably within the range from 1 to 30 mol %, and more preferably from 10 to 20 mol %.

In the present invention, the component (A1) is preferably a copolymer having the structural units (a1), (a2) and (a3). Examples of such a copolymer include a copolymer consisting of the structural units (a1) and (a2) and (a3), and a copolymer consisting of the structural units (a1), (a2), (a3) and (a4).

In the present invention, as the component (A1), a copolymer (A1-11) including a combination of three structural units represented by general formula (A1-11) shown below is preferable.

[Chemical Formula 34]

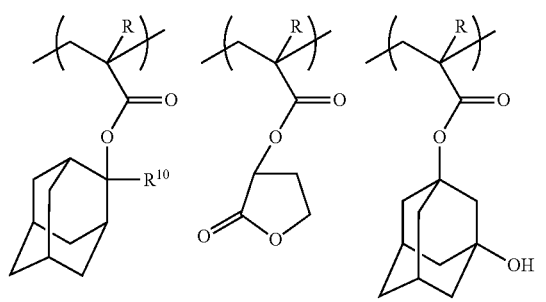

(A-11)

wherein R is as defined above; and $R^{10}$ represents a lower alkyl group.

In general formula (A1-11) above, R is as defined above, and $R^{10}$ represents a lower alkyl group.

The lower alkyl group for $R^{10}$ is the same as the lower alkyl group for R, and is preferably a methyl group or ethyl group, and most preferably a methyl group. composition are improved.

The component (A1) can be obtained, for example, by a conventional radical polymerization or the like of the monomers corresponding with each of the structural units, using a radical polymerization initiator such as azobisisobutyronitrile (AIBN) or dimethyl-2,2-azobis(isobutylate).

Furthermore, in the component (A1), by using a chain ter agent such as HS—$CH_2$—$CH_2$—$CH_2$—$C(CF_3)_2$—OH, a —$C(CF_3)_2$—O group can be introduced at the terminals of the component (A1). Such a copolymer having introduced a hydroxyalkyl group in which some of the hydrogen atoms of the alkyl group are substituted with fluorine atoms is effective in reducing developing defects and LER (line edge roughness; unevenness of the side walls of a line pattern).

The weight average molecular weight (Mw) (the polystyrene equivalent value determined by gel permeation chromatography (GPC)) of the component (A1) is not particularly limited, but is preferably 2,000 to 50,000, more preferably 3,000 to 30,000, and most preferably 5,000 to 20,000. By making the weight average molecular weight no more than the upper limit of the above-mentioned range, the component (A1) exhibits satisfactory solubility in a resist solvent when used as a resist. On the other hand, by making the weight average molecular weight at least as large as the lower limit of the abovementioned range, dry etching resistance and cross-sectional shape of the resist pattern becomes satisfactory.

Further, the dispersity (Mw/Mn) is preferably 1.0 to 5.0, more preferably 1.0 to 3.0, and most preferably 1.2 to 2.5. Here, M is to number average molecular weight.

<Component (B)>

As the component (B), there is no particular limitation, and any of the known acid generators used in conventional chemically amplified resist compositions can be used. Examples of these acid generators are numerous, and include onium salt-based acid generators such as iodonium salts and sulfonium salts; oxime sulfonate-based acid generators; diazomethane-based acid generators such as bisalkyl or bisaryl sulfonyl diazomethanes and poly(bis-sulfonyl)diazomethanes; nitrobenzylsulfonate-based acid generators; iminosulfonate-based acid generators; and disulfone-based acid generators.

As an onium salt-based acid generator a compound represented by general formula (b-1) or (b-2) shown below can be preferably used

[Chemical Formula 35]

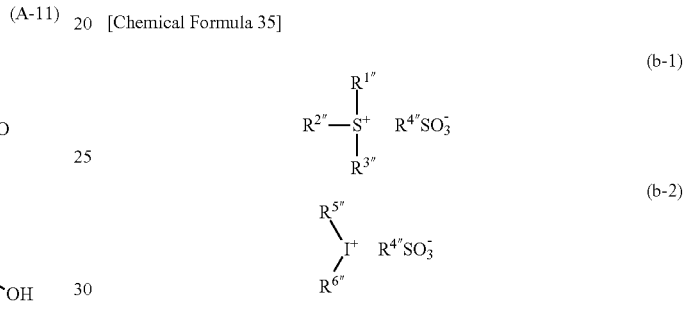

wherein $R^{1\prime\prime}$ to $R^{3\prime\prime}$, $R^{5\prime\prime}$ and $R^{6\prime\prime}$ each independently represents an aryl group or alkyl group, wherein two of $R^{1\prime\prime}$ to $R^{3\prime\prime}$ in formula (b-1) may be bonded to each other to form a ring with the sulfur atom; and $R^{4\prime\prime}$ represents a linear, branched or cyclic alkyl group or fluorinated alkyl group, with the proviso that at least one of $R^{1\prime\prime}$ to $R^{3\prime\prime}$ represents an aryl group, and at least one of $R^{5\prime\prime}$ and $R^{6\prime\prime}$ represents an aryl group.

In formula (b-1), $R^{1\prime\prime}$ to $R^{3\prime\prime}$, each independently represents an aryl group or an allyl group. In formula b-1), two of $R^{1\prime\prime}$ to $R^{3\prime\prime}$ in formula (b-1) may be bonded to each other to form a ring with the sulfur atom.

Further, among $R^{1\prime\prime}$ to $R^{3\prime\prime}$, at least one group represents an aryl group. Among $R^{1\prime\prime}$ to $R^{3\prime\prime}$, two or more groups are preferably awl groups, and it is particularly desirable that all of $R^{1\prime\prime}$ to $R^{3\prime\prime}$ are aryl groups.

The aryl group for $R^{1\prime\prime}$ to $R^{3\prime\prime}$ is not particularly limited. For example, an aryl group having 6 to 20 carbon atoms may be used in which some or all of the hydrogen atoms of the aryl group may or may not be substituted with all groups, alkoxy groups, halogen atoms or hydroxyl groups.

The aryl group is preferably an aryl group having 6 to 10 carbon atoms because it can be synthesized at a low cost. Specific examples thereof include a phenyl group and naphthyl group.

The alkyl group, with which hydrogen atoms of the aryl group may be substituted, is preferably an alkyl group having 1 to 5 carbon atoms, and most preferably a methyl group, an ethyl group, a propyl group, an n-butyl group, or a tert-butyl group.

The alkoxy group, with which hydrogen atoms of the aryl group may be substituted, is preferably an alkoxy group having 1 to 5 carbon atoms, and most preferably a methoxy group or an ethoxy group.

The halogen atom, with which hydrogen atoms of the aryl group may be substituted, is preferably a fluorine atom.

The alkyl group for $R^{1'''}$ to $R^{3'''}$ is not particularly limited and includes, for example, a linear, branched or cyclic alkyl group having 1 to 10 carbon atoms. In terms of achieving excellent resolution, the alkyl group preferably has 1 to 5 carbon atoms. Specific examples hereof include a methyl group, an ethyl group, an n-propyl group, an isopropyl group, an n-butyl group, an isobutyl group, an n-pentyl group, a cyclopentyl group, a hexyl group, a cyclohexyl group, a nonyl group, and a decanyl group, and a methyl group is most preferable because it is excellent in resolution and can be synthesized at a low cost.

It is particularly desirable that each of $R^{1'''}$ to $R^{3'''}$ is a phenyl group or a naphthyl group.

When two of $R^{1'''}$ to $R^{3'''}$ in formula (b-1) are bonded to each other to form a ring with the sulfur atom, it is preferable that the two of $R^{1'''}$ to $R^{3'''}$ form a 3 to 10-membered ring including the sulfur atom, and it is particularly desirable that the two of $R^{1'''}$ to $R^{3'''}$ form a 5 to 7-membered ring including the sulfur atom. When two of $R^{1'''}$ to $R^{3'''}$ in formula (b-1) are bonded to each other to form a ring with the sulfur atom, the remaining one of $R^{1'''}$ to $R^{3'''}$ is preferably an aryl group. As examples of the aryl group, the same as the above-mentioned aryl groups for $R^{1'''}$ to $R^{3'''}$ can be exemplified.

$R^{4'''}$ represents a linear, branched or cyclic alkyl or fluorinated alkyl group.

The linear or branched alkyl group preferably has 1 to 10 carbon atoms, more preferably 1 to 8 carbon atoms, and most preferably 1 to 4 carbon atoms.

The cyclic alkyl group is preferably a cyclic group, as described for $R^{1'''}$, having 4 to 15 carbon atoms, more preferably 4 to 10 carbon atoms, and most preferably 6 to 10 carbon atoms.

The fluorinated alkyl group preferably has 1 to 10 carbon atoms, more preferably 1 to 8 carbon atoms, and most preferably 1 to 4 carbon atoms. Further, the fluorination ratio of the fluorinated alkyl group percentage of fluorine atoms within the alkyl group) is preferably from 10 to 100%, more preferably from 50 to 100%, and it is particularly desirable that all hydrogen atoms are substituted with fluorine atoms (i.e., the fluorinated alkyl group is a perfluoroalkyl group) because the acid se increases.

$R^{4'''}$ is most preferably a linear or cyclic alkyl group or fluorinated alkyl group.

In formula (b-2), $R^{5'''}$ and $R^{6'''}$ each independently represents an aryl group or alkyl group. At least one of $R^{5'''}$ and $R^{6'''}$ represents an aryl group. It is preferable that both of $R^{5'''}$ and $R^{6'''}$ represent an aryl group.

As the aryl group for $R^{5'''}$ and $R^{6'''}$, the same as the aryl groups for $R^{1'''}$ to $R^{3'''}$ can be exemplified.

As the alkyl group for $R^{5'''}$ and $R^{6'''}$, the same as the alkyl groups for $R^{1'''}$ to $R^{3'''}$ can be exemplified.

It is particularly desirable that both of $R^{5'''}$ and $R^{6'''}$ represents a phenyl group.

As $R^{4'''}$ in formula (b-2), the same as those mentioned above for $R^{4'''}$ in formula (b-1) can be exemplified.

Specific examples of suitable onium salt-based acid generators represented by formula (b-1) or (b-2) include diphenyliodonium trifluoromethanesulfonate or nonafluorobutanesulfonate; bis(4-tert-butylphenyl)iodonium trifluoromethanesulfonate or nonafluorobutanesulfonate; triphenylsulfonium trifluoromethanesulfonate, heptafluoropropanesulfonate or nonafluorobutanesulfonate; tri(4-methylphenyl)sulfonium trifluoromethanesulfonate, heptafluoropropanesulfonate or nonafluorobutanesulfonate; dimethyl(4-hydroxynaphthyl)sulfonium trifluoromethanesulfonate, heptafluoropropanesulfonate or nonafluorobutanesulfonate; monophenyldimethylsulfonium trifluoromethanesulfonate, heptafluoropropanesulfonate or nonafluorobutanesulfonate; diphenylmonomethylsulfonium trifluoromethanesulfonate, heptafluoropropanesulfonate or nonafluorobutanesulfonate; (4-methylphenyl)diphenylsulfonium trifluoromethanesulfonate, heptafluoropropanosulfonate or nonafluorobutanesulfonate; (4-methoxyphenyl)diphenylsulfonium trifluoromethanesulfonate, heptafluoropropanesulfonate or nonafluorobutanesulfonate; tri(4-tert-butyl)phenylsulfonium trifluoromethanesulfonate, heptafluoropropanesulfonate or nonafluorobutanesulfonate; diphenyl(1-(4-methoxy)naphthyl)sulfonium trifluoromethanesulfonate, heptafluoropropanesulfonate or nonafluorobutanesulfonate; di(1-naphthyl)phenylsulfonium trifluoromethanesulfonate, heptafluoropropanesulfonate or nonafluorobutanesulfonate; 1-phenyltetrahydrothiophenium trifluoromethanesulfonate, hepatfluoropropanesulfonate or nonafluorobutanesulfonate; 1-(4-methylphenyltetrahydrothiophenium trifluoromethanesulfonate, heptafluoropropanesulfonate or nonafluorobutanesulfonate; 1-(3,5-dimethyl-4-hydroxyphenyl)tetrahydrothiophenium trifluoromethanesulfonate, haptafluoropropanesulfonate or nonafluorobutanesulfonate; 1-(4-methoxynaphthalene-1-yl)tetrahydrothiophenium trifluoromethanesulfonate, heptafluoropropanesulfonate or nonafluorobutanesulfonate; 1-(4-ethoxynaphthalene-1-yl)tetrahydrothiophenium trifluoromethanesulfonate, heptafluoropropanesulfonate or nonafluorobutanesulfonate; 1-(4-n-butoxynaphthalene-1-yl)tetrahydrothiophenium trifluoromethanesulfonate, heptafluoropropanesulfonate or nonafluorobutanesulfonate; 1-phenyltetrahydrothiopyranium trifluoromethanesulfonate, heptafluoropropanesulfonate or nonafluorobutanesulfonate; 1-(4-hydroxyphenyl)tetrahydrothiopyranium trifluoromethanesulfonate, heptafluoropropanesulfonate or nonafluorobutanesulfonate; 1-(3,5-dimethyl-4-hydroxyphenyl)tetrahydrothiopyranium trifluoromethanesulfonate, heptafluoropropanesulfonate or nonafluorobutanesulfonate; and 1-(4-methylphenyl)tetrahydrothiopyranium trifluoromethanesulfonate, heptafluoropropanesulfonate or nonafluorobutanesulfonate.

It is also possible to use onium salts in which the anion moiety of these onium salts are replaced by methanesulfonate, n-propanesulfonate, n-butanesulfonate, or n-octanesulfonate.

Further, onium salt-based acid generators in which the anion moiety in general formula (b-1) or (b-2) is replaced by an anion moiety represented by general formula (b-3) or (b-4) shown below (the cation moiety is the same as (b-1) or (b-2)) may be used.

[Chemical Formula 36]

(b-3)

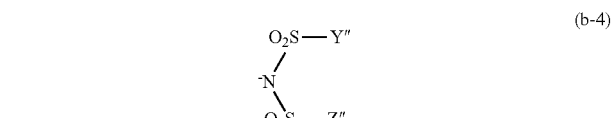

(b-4)

wherein X" represents an alkene group of 2 to 6 carbon atoms in which at least one hydrogen atom ha been substituted with a fluorine atom; and Y" and Z" each independently represents an alkyl group of 1 to 10 carbon atoms in which at least one hydrogen atom has been substituted with a fluorine atom.

X″ represents a linear or branched alkylene group in which at least one hydrogen atom has been substituted with a fluorine atom and the alkylene group has 2 to 6 carbon atoms, preferably 3 to 5 carbon atoms, and most preferably 3 carbon atoms.

Y″ and Z″ each independently represents a linear or branched alkyl group in which at least one hydrogen atom has been substituted with a fluorine atom, and the alkyl group has 1 to 10 carbon atoms, preferably 1 to 7 carbon atoms, and more preferably 1 to 3 carbon atoms.

The smaller the number of carbon atoms of the alkylene group of X″ or those of the alkyl group of Y″ and Z″ within the range of the number of carbon atoms, the better the solubility in a resist solvent.

Further, in the alkylene group of X″ or the alkyl group of Y″ and Z″, it is preferable that the number of hydrogen atoms substituted with fluorine atoms is as large as possible, as the acid strength increases, and the transparency to high energy radiation of 200 nm or less or electron beam is improved. The fluorination ratio of the alkylene group or alkyl group is preferably from 70 to 100%, more preferably from 90 to 100%, and it is particularly desirable that the alkylene group or alkyl group be a perfluoroalkylene group or perfluoroalkyl group in which all hydrogen atoms are substituted with fluorine atoms.

Furthermore, as an onium salt-based acid generator, a sulfonium salt having a cation moiety represented by general formula (b-5) or (b-6) shown below may be used.

[Chemical Formula 37]

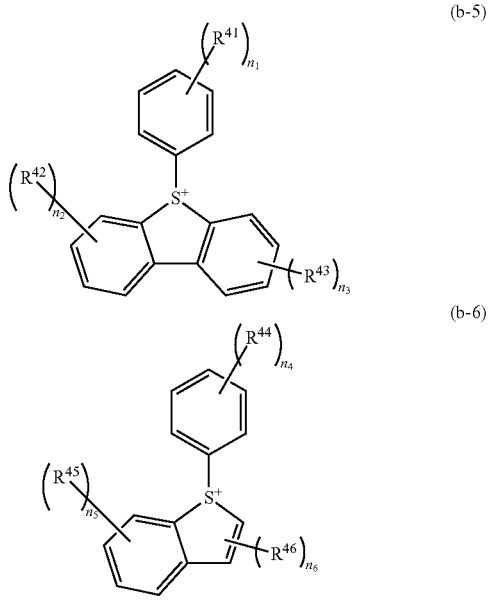

wherein $R^{41}$ to $R^{46}$ each independently represents an alkyl group, an acetyl group, an alkoxy group, a carboxy group, a hydroxyl group or a hydroxyalkyl group; $n_1$ to $n_5$ each independently represents an integer of 0 to 3; and $n_6$ represents an integer of 0 to 2.

With respect to $R^{41}$ to $R^{46}$, the alkyl group is preferably an alkyl group of 1 to 5 carbon atoms, more preferably a linear or branched alkyl group, and most preferably a methyl group, ethyl group, propyl group, isopropyl group, n-butyl group or tert butyl group.

The alkoxy group is preferably an alkoxy group of 1 to 5 carbon atoms, more preferably a linear or branched alkoxy group, and most preferably a methoxy group or ethoxy group.

The hydroxyalkyl group is preferably the aforementioned alkyl group in which one or more hydrogen atoms have been substituted with hydroxy groups, and examples thereof include a hydroxymethyl group, hydroxyethyl group and hydroxypropyl group.

When the subscripts $n_1$ to $n_6$ of $R^{41}$ to $R^{46}$ represent an integer of 2 or more, the plurality of $R^{41}$ to $R^{46}$ way be the same or different.

$n_1$ is preferably 0 to 2, more preferably 0 or 1, and still more preferably 0.

It is preferable that $n_2$ and $n_3$ each independently represent 0 or 1, and more preferably 0.

$n_4$ is preferably 0 to 2, and more preferably 0 or 1.

$n_5$ is preferably 0 or 1, and more preferably 0.

$n_6$ is preferably 0 or 1, and more preferably 1.

The anion moiety of the sulfonium salt having a cation moiety represented by general formula (b-5) or (b-6) is not particularly limited, and the same anion moieties for onium salt-based acid generators which have been proposed may be used Examples of such anion moieties include fluorinated alkylsulfonic acid ions such as anion moieties ($R^{4''}SO_3^-$) for onium salt-based acid generators represented by general formula (b-1) or (b-2) shown above; and anion moieties representes sented by general formula (b-3) or (b-4) shown above. Among these, fluorinated alkylsulfonic acid ions are preferable, more preferably fluorinated alkylsulfonic acid ions of 1 to 4 carbon atoms, and linear perfluoroalkylsulfonic acid ions of 1 to 4 carbon atoms are particularly desirable. Specific examples include a trifluoromethylsulfonic acid ion, heptafluoro-n-propylsulfonic ion and nonafluoro n-butylsulfonic acid ion.

In the present description, an oximesulfonate-based acid generator is a compound having at least one group represented by general formula (B-1) shown below, and has a feature of generating acid by irradiation. Such oximesulfonate-based acid generators are widely used for a chemically amplified resist composition, and can be appropriately selected.

[Chemical Formula 38]

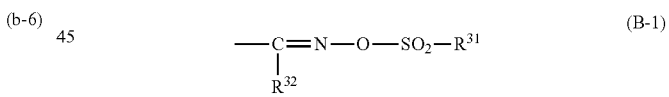

wherein $R^{31}$ and $R^{32}$ each independently represents an organic group.

The organic group for $R^{31}$ and $R^{32}$ refers to a group containing a carbon atom, and may include atoms other than carbon atoms (e.g., a hydrogen atom, an oxygen atom, a nitrogen atom, a sulfur atom, a halogen atom (such as a fluorine atom an chlorine atom) and the like).

As the organic group for $R^{31}$, a linear branched, or cyclic alkyl group or aryl group is preferable. The alkyl group or the aryl group may have a substituent. The substituent is not particularly limited, and examples thereof include a fluorine atom and a linear, branched, or cyclic alkyl group having 1 to 6 carbon atoms. The expression "having a substituent" means that some or all of the hydrogen atoms of the alkyl group or the aryl group are substituted with substituents.

The alkyl group preferably has 1 to 20 carbon atoms, more preferably 1 to 10 carbon atoms, still more preferably 1 to 8 carbon atoms, still more preferably 1 to 6 carbon atoms, and most preferably 1 to 4 carbon atoms. As the alkyl group, a partially or completely halogenated alkyl group (hereinafter, sometimes referred to as a "halogenated alkyl group") is particularly desirable. The "partially halogenated alkyl group" refers to an alkyl group in which some of the hydrogen atoms are substituted with halogen atoms, and the "completely halogenated alkyl group" refers to an alkyl group in which all of the hydrogen atoms are substituted with halogen atoms. Examples of the halogen atom include a fluorine atom, a chlorine atom, a bromine atom and an iodine atom, and a fluorine atom is particularly desirable. In other words, the halogenated alkyl group is preferably a fluorinated alkyl group.

The aryl group preferably has 4 to 20 carbon atoms, more preferably 4 to 10 carbon atoms, and most preferably 6 to 10 carbon atoms. As the aryl group, partially or completely halogenated aryl group is particularly desirable. The "partially halogenated aryl group" refers to an aryl group in which some of the hydrogen atoms are substituted with halogen atoms, and the "completely halogenated aryl group" refers to an aryl group in which all of hydrogen atoms are substituted with halogen atoms.

As $R^{31}$, a alkyl group of 1 to 4 carbon atoms which has no substituent or a fluorinated alkyl group of 1 to 4 carbon atoms is particularly desirable.

As the organic group for $R^{32}$, a linear, branched, or cyclic aryl group, aryl group, or cyano group is preferable. Examples of the alkyl group and the aryl group for $R^{32}$ the same as those of the alkyl group and the aryl group for $R^{31}$.

As $R^{32}$, a cyano group, an alkyl group of 1 to 8 carbon atoms having no substituent or a fluorinated alkyl group of 1 to 8 carbon atoms is particularly desirable.

Preferred examples of the oxime sulfonate-based acid generator include compounds represented by general formula (B-2) or (B-3) shown below.

[Chemical Formula 39]

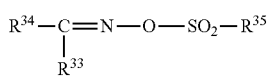

(B-2)

wherein $R^{33}$ represents a cyano group, an allyl group having no substituent or a halogenated alkyl group; $R^{34}$ represents an aryl group; and $R^{35}$ represents an alkyl group having no substituent or a halogenated alkyl group.

[Chemical Formula 40]

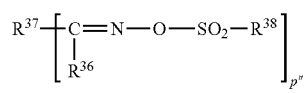

(B-3)

wherein $R^{36}$ represents a cyano group, an alkyl group having no substituent or a halogenated alkyl group; $R^{37}$ represents a divalent or trivalent aromatic hydrocarbon group; $R^{38}$ represents an alkyl group having no substituent or a halogenated alkyl group; and p" represents 2 or 3.

In general formula (B-2), the alkyl group having no substituent or the halogenated alkyl group for $R^{33}$ preferably has 1 to 10 carbon atoms, more preferably 1 to 8 carbon atoms, and most preferably 1 to 6 carbon atoms.

As $R^{33}$, a halogenated alkyl group is preferable, and a fluorinated alkyl group is more preferable.

The fluorinated alkyl group for $R^{33}$ preferably has 50% or more of the hydrogen atoms thereof fluorinated, more preferably 70% or more, and most preferably 90% or more.

Examples of the aryl group for $R^{34}$ include groups in which one hydrogen atom has been removed from an aromatic hydrocarbon ring, such as a phenyl group, a biphenyl group, a fluorenyl group, a naphthyl group, an anthryl group, and a phenanetryl group, and heteroaryl groups in which some of the carbon atoms constituting the ring(s) of these groups are substituted with hetero atoms such as an oxygen atom, a sulfur atom, and a nitrogen atom. Of these, a fluorenyl group is preferable.

The aryl group for $R^{34}$ may have a substituent such as an alkyl group of 1 to 10 carbon atoms, a halogenated alkyl group, or an alkoxy group. The alkyl group and halogenated alkyl group as the substituent preferably has 1 to 5 carbon atoms, and more preferably 1 to 4 carbon atoms. The halogenated alkyl group is preferably a fluorinated alkyl group.

The alkyl group having no substituent or the halogenated alkyl group for $R^{35}$ preferably has 1 to 10 carbon atoms, more preferably 1 to 8 carbon atoms, and most preferably 1 to 6 carbon atoms.

As $R^{35}$, a halogenated alkyl group is preferable, and a fluorinated alkyl group is more preferable.

In terms of enhancing the strength of the acid generated, the fluorinated alkyl group for $R^{35}$ preferably has 50% or more of the hydrogen atoms fluorinated, more preferably 70% or more, still more preferably 90% or more. A completely fluorinated alkyl group in which 100% of the hydrogen atoms are substituted with fluorine atoms is particularly desirable.

In general formula (B-3), the alkyl group having no substituent and the halogenated alkyl group for $R^{36}$ are the same as the alkyl group having no substituent and the halogenated all group for $R^{33}$.

Examples of the divalent or trivalent aromatic hydrocarbon group for $R^{27}$ include groups in which one or two hydrogen atoms have been removed from the aryl group for $R^{34}$.

As the alkyl group having no substituent or the halogenated alkyl group for $R^{38}$, the same one as the alkyl group having no substituent or the halogenated alkyl group for $R^{35}$ can be used.

p" is preferably 2.

Specific examples of suitable oxine sulfonate-based acid generators include α-(p-toluenesulfonyloxyimino)-benzyl cyanide, α-(p-chlorobenzenesulfonyloxyimino)-benzyl cyanide, α-(4-nitrobenzenesulfonyloxyimino)-benzyl cyanide, α-(4-nitro-2-trifluoromethylbenzenesulfonyloxyimino)-benzyl cyanide, α-(benzenesulfonyloxyimino)-4-chlorobenzyl cyanide, α-(benzenesulfonyloxyimino)-2,4-dichlorobenzyl cyanide, α-(benzenesulfonyloxyimino)-2,6-dichlorobenzyl cyanide, α-(benzenesulfonyloxyimino)-4-methoxybenzyl cyanide, α-(2-chlorobenzenesulfonyloxyimino)-4-methoxy benzyl cyanide, α-(benzenesulfonyloxyimino)-thien-2-yl acetonitrile, α-(4-dodecylbenzenesulfonyloxyimino)benzyl cyanide, α-[(p-toluenesulfonyloxyimino)-4-methoxyphenyl]acetonitrile, α-[(dodecylbenzenesulfonyloxyimino)-4-methoxyphenyl]acetonitrile, α-(tosyloxyimino)-4-thienyl cyanide, α-(methylsulfonyloxyimino)-1-cyclopentenyl acetonitrile; α-(methylsulfonyloxyimino)-1-cyclohexenyl acetonitrile, α-(methylsulfonyloxyimino)-1-cycloheptenyl acetonitrile, α-(methylsulfonyloxyimino)-1-cyclooctenyl acetonitrile, α-(trifluoromethylsulfonyloxyimino)-1-cyclopentenyl acetonitrile, α-(trifluoromethylsulfonyloxyimino)- cyclohexyl acetonitrile, α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile, α-(cyclohexylsulfonyloxyimino)-cyclohexyl acetonitrile, α-(cyclohexylsulfonyloxyimino)-1-cyclopentenyl acetonitrile, α-(ethylsulfonyloxyimino)-1-cyclopentenyl acetonitrile, α-(isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile, α-(n-butylsulfonyloxyimino)-1-cyclohexenyl acetonitrile, α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile.

Further, oxime sulfonate-based acid generators disclosed in Japanese Unexamined Patent Application, First Publication No. Hei 9-208554 (Chemical Formulas 18 and 19 shown in paragraphs [0012] to [0014]) and oxime sulfonate-based acid generators disclosed in WO 2004/074242A2 (Examples 1 to 40 described at pages 65 to 85) may be preferably used.

Furthermore, as preferable examples, the following can be exemplified.

[Chemical Formula 41]

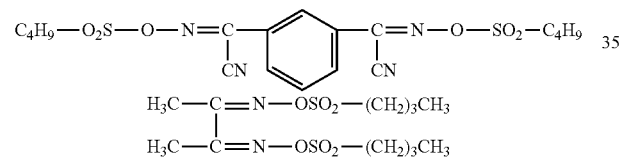

[Chemical Formula 42]

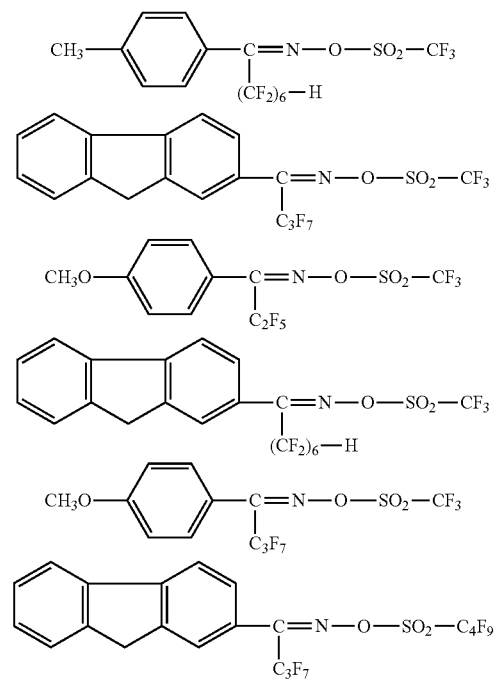

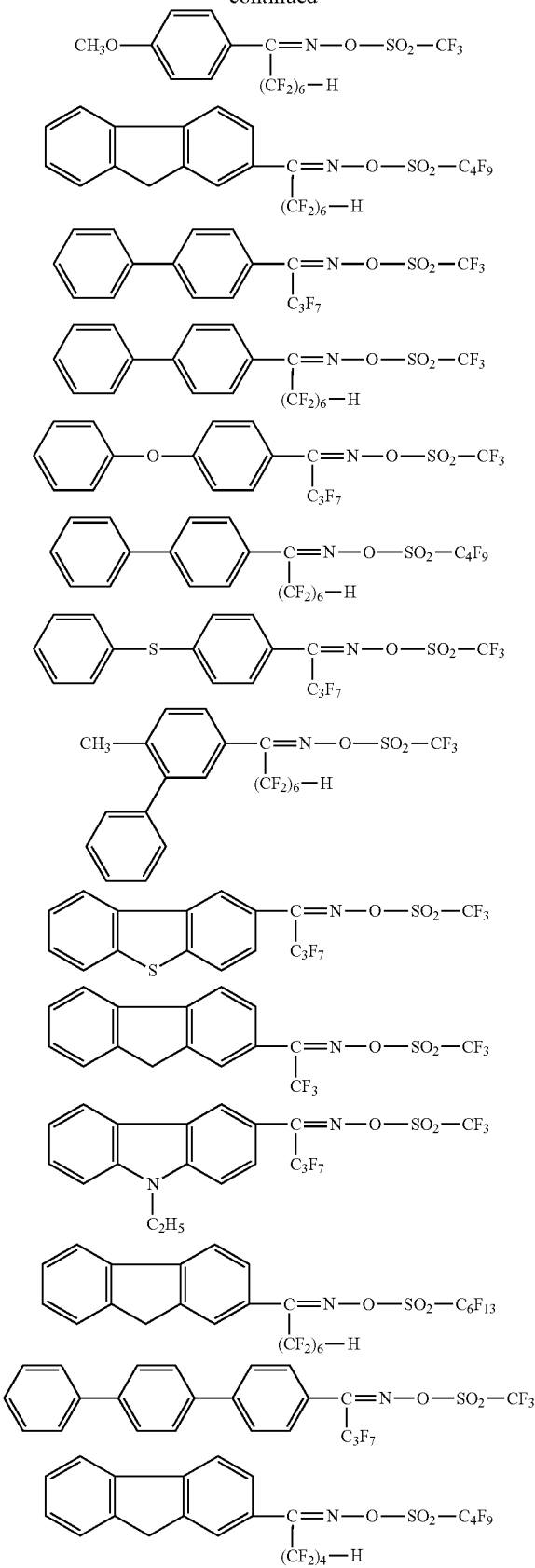

Among the above-exemplified compounds, the following 4 compounds are preferable.

[Chemical Formula 43]

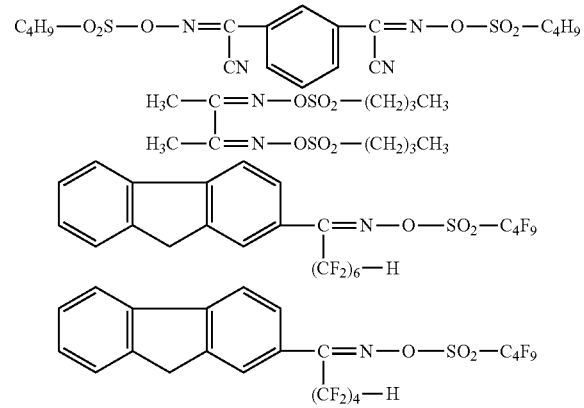

Of the aforementioned diazomethane-based acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Further, diazomethane-based acid generators disclosed in Japanese Unexamined Patent Application, First Publication No. Hei 11-035551, Japanese Unexamined Patent Application, First Publication No. Hei 11-035552 and Japanese Unexamined Patent Application, First Publication No. Hei 11-035573 may be preferably used.

Furthermore, as poly(bis-sulfonyl)diazomethanes, those disclosed in Japanese Unexamined Patent Application, First Publication No. Hei 11-322707, including 1,3-bis(phenylsulfonyldiazomethylsulfonyl)propane, 1,4-bis(phenylsulfonyldiazomethylsulfonyl)butane, 1,6-bis(phenylsulfonyldiazomethylsulfonyl)hexane, 1,10-bis(phenylsulfonyldiazomethylsulfonyl)decane, 1,2-bis(cyclohexylsulfonyldiazomethylsulfonyl)ethane, 1,3-bis(cyclohexylsulfonyldiazomethylsulfonyl)propane, 1,6-bis(cyclohexylsulfonyldiazomethylsulfonyl)hexane, and 1,10-bis(cyclohexylsulfonyldiazomethylsulfonyl)decane, may be exemplified.

As the component (B), one type of acid generator may be used, or two or more types may be used in combination.

In the present invention, as the component (B), it is preferable to use an onium salt having a fluorinated alkylsulfonic acid ion as the anion moiety. It is particularly desirable to use (4-methylphenyl)diphenylsulfonium nonafluoro-n-butane sulfonate.

The amount of the component (B) is typically 0.5 to 30 parts by weight, and preferably 1 to 10 parts by weight, relative to 100 parts by weight of the component (A). When the amount of the component (B) is within the above-mentioned range, formation of a resist pattern can be satisfactorily performed. Further, by virtue of the above-mentioned range, a uniform solution can be obtained and the storage stability becomes satisfactory.

<Component (C)>

The positive resist composition for immersion exposure according to the present invention contains, as an essential component (C), the aforementioned fluorine-containing polymeric compound, i.e. a fluorine-containing polymeric compound obtained by polymerizing only polymerizable monomers represented by general formula (c1-0) shown above, or a fluorine-containing polymeric compound consisting of a structural unit (c1) represented by general formula (c1-1) shown above. It is particularly desirable to use either a fluorine-containing polymeric compound obtained by polymerizing only 1-(2,2,2-trifluoroethoxy)ethyl(meth)acrylate or 1-[2-(2,2,2-trifluoroethoxy)ethoxy]ethyl(meth)acrylate, or a fluorine-containing polymeric compound consisting of a structural unit (c1) represented by chemical formula (c1-1-1) or (c1-1-2) shown below.

[Chemical Formula 44]

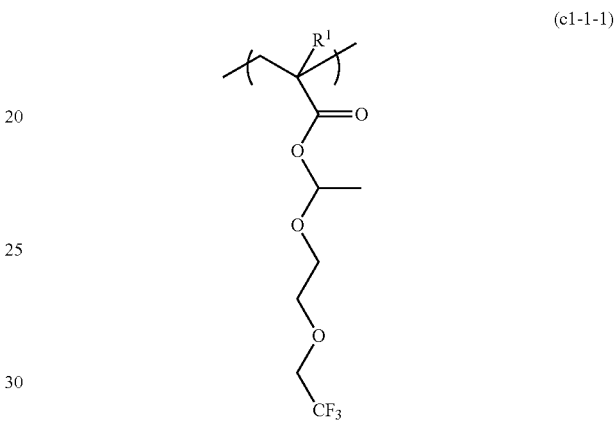

wherein $R^1$ represents a hydrogen atom or a methyl group.

[Chemical Formula 45]

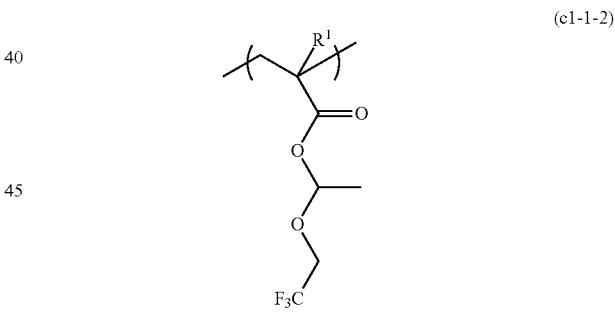

wherein $R^1$ represents a hydrogen atom or a methyl group.

As the component (C), one type may be used alone, or two or more types may be used in combination. In the present invention, the terminal portion ($-CH(CH_3)-O-R^2$) of the structural unit (c1) represented by general formula (c1-1) above is a group exhibiting dissolution inhibiting effect (dissolution inhibiting group). Therefore, since such a resin consisting of the structural unit (c1) exhibits increased alkali solubility under action of acid, such a resin falls within the category of the component (A). However, such a resin is regarded as falling within the category of component (C), but not the component (A). In other words, the component (A) excludes resins consisting of the structural unit (c1).

The weight average molecular weight (Mw) (the polystyrene equivalent value determined by gel permeation chromatography (GPC)) of the component (C) is not particularly limited, but is preferably 3,000 to 50,000, more preferably 5,000 to 30,000, and still more preferably 5,000 to 20,000. By making the weight average molecular weight no more than the upper limit of the above-mentioned range, a satisfactory solubility in a resist solvent for use as a resist can be obtained. On the other hand, by making the weight average molecular weight at least as large as the lower limit of the above-mentioned range, dry etching resistance and cross-sectional shape of the resist pattern becomes satisfactory.

Further, the dispersity (Mw/Mn) is preferably 1.0 to 5.0, more preferably 1.0 to 3.0, and most preferably 1.2 to 2.5. Here, Mn is the number avenge molecular weight.

The amount of the component (C) within the positive resist composition for immersion exposure according to the present invention, based on the amount of the component (A), is preferably 0.1 to 20% by weight more preferably 0.5 to 20% by weight still more preferably 1 to 10% by weight, and most preferably 1 to 5% by weight By making the amount of the component (C) at least as large as the lower limit of the above-mentioned range, the effect of improving the hydrophobicity of the resist composition becomes excellent. On the other band, by making the amount of the component (C) no more than the upper limit of the above-mentioned range, the lithography properties are improved.

Optional Component>

It is preferable that the resist composition for immersion exposure according to the present invention further contain a nitrogen-containing organic compound (D) (hereafter referred to as the component (D)) as at optional component. By containing the component (D), the resist pattern shape and the post exposure stability of the latent image formed by the pattern-wise exposure of the resist layer are improved.

A multitude of these components CD) have already been proposed, and any of these known compounds may be used, although a cyclic amine, an aliphatic amine, and particularly a secondary aliphatic amino or tertiary aliphatic amine is preferable. An aliphatic amine is an amine having one or more aliphatic groups, and the aliphatic groups preferably have 1 to 12 carbon atoms.

Examples of these aliphatic amines include amines in which at least one hydrogen atom of ammonia ($NH_3$) has been substituted with an alkyl group or hydroxyalkyl group of no more than 12 carbon atoms (i.e., alkylamines or alkylalcoholamines).

Specific examples include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decanylamine, and tri-n-dodecylamine; and alkyl alcohol amines such as diethanolamine, triethanolamine, diisopropanolamine, triisopropanolamine, di-n-octanolamine, and tri-n-octanolamine.

Among these, trialkylamines and alkylalcoholamines are preferable, trialkylamines are more preferable, and tri-n-pentylamine is particularly desirable.

Examples of the cyclic amine include heterocyclic compounds containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine, and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetraamine, and 1,4-diazabicyclo[2.2.2]octane.

As the component (D), one type of acid generator may be used, or two or more types may be used in combination.

When the component (D) is added to the resist composition, the component (B) is typically used in an amount within a range from 0.01 to 5.0 parts by weight, relative to 100 parts by weight of the component (A).

Furthermore, in the resist composition for immersion exposure according to the present invention, for preventing any deterioration in sensitivity, and improving the resist pattern shape and the post exposure stability of the latent image formed by the pattern-wise exposure of the resist layer, at least one compound (E) (hereafter referred to as the component (E)) selected from the group consisting of an organic carboxylic acid, or a phosphorus oxo acid or derivative thereof can be added Examples of suitable organic carboxylic acids include acetic acid, malonic acid, citric acid, malic acid, succinic acid, benzoic acid, and salicylic acid.

Examples of phosphorus oxo acids or derivatives thereof include phosphoric acid, phosphonic acid and phosphinic acid. Among these, phosphonic acid is particularly desirable.

Examples of oxo acid derivatives include esters in which a hydrogen atom within the above-mentioned oxo acids is substituted with a hydrocarbon group. Examples of the hydrocarbon group include an alkyl group of 1 to 5 carbon atoms and an aryl group of 6 to 15 carbon atoms.

Examples of phosphoric acid derivatives include phosphoric acid esters such as di-n-butyl phosphate and diphenyl phosphate.

Examples of phosphonic acid derivatives include phosphonic acid esters such as dimethyl phosphonate, di-n-butyl phosphonate, phenylphosphonic acid, diphenyl phosphonate and dibenzyl phosphonate.

Examples of phosphinic acid derivatives include phosphinic acid esters such as phenylphosphinic acid.

As the component (E), one type may be used alone, or two or more types may be used in combination.

When the component (E) is added to the resist composition, the component (E) is typically used in an amount within a range from 0.01 to 5.0 parts by weight, relative to 100 parts by weight of the component (A).

If desired, other miscible additives can also be added to the positive resist composition for immersion exposure according to the present invention Examples of such miscible additives include additive resins for improving the performance of the resist film, surfactants for improving the applicability, dissolution inhibitors, plasticizers, stabilizers, colorants, halation prevention agents, and dyes.

The resist composition for immersion exposure according to the present invention can be prepared by dissolving the materials for the resist composition in an organic solvent (hereafter, frequently referred to as "component (S)").

The component (S) may be any organic solvent which can dissolve the respective components to give a uniform solution, and any one or more kinds of organic solvents can be appropriately selected from those which have been conventionally known as solvents for a chemically amplified resist.

Examples thereof include lactones such as γ-butyrolactone; ketones such as acetone, methyl ethyl ketone, cyclohexanone, methyl-n-pentyl ketone, methyl isopentyl ketone, and 2-heptanone; polyhydric alcohols and derivatives thereof, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond; cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; and aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene and mesitylene.

These solvents can be used individually, or in combination as a mixed solvent.

Among these, propylene glycol monomethyl ether acetate (PGMEA), propylene glycol monomethyl ether (PGME) and ethyl lactate (EL) are preferable.

Further, among the mixed solvents, a mixed solvent obtained by mixing PGMEA with a polar solvent is preferable. The mixing ratio (weight ratio) of the mixed solvent can be appropriately determined, taking into consideration the compatibility of the PGMEA with the polar solvent, but is preferably in the range of 1:9 to 9:1, more preferably from 2:8 to 8:2.

Specifically, when EL is mixed as the polar solvent, the PGMEA:EL weight ratio is preferably from 1:9 to 9:1, and more preferably from 2:8 to 8:2. Alternatively, when PGME is mixed as the polar solvent, the PGMEA:PGME is preferably from 1:9 to 9:1, more preferably from 2:8 to 8:2, and still more preferably 3:7 to 7:3.

Further, as the component (S), a mixed solvent of at least one of PGMEA and EL with γ-butyrolactone is also preferable. The mixing ratio (former:latter) of such a mixed solvent is preferably from 70:30 to 95:5.

The amount of the organic solvent is not particularly limited, and is appropriately adjusted to a concentration which enables coating of a coating solution to a substrate, depending on the thickness of the coating film. In general, the organic solvent is used in an amount such that the solid content of the resist composition becomes within the range from 2 to 20% by weight, and preferably from 5 to 15% by weight.

Dissolving of the materials for a resist composition in the component (S) can be conducted by simply mixing and siring each of the above components together using conventional methods, and where required, the composition may also be mixed and dispersed using a dispersion device such as a dissolver, a homogenizer, or a triple roll mill. Furthermore, following mixing, the composition may also be filtered using a mesh, a membrane filter or the like.

By virtue of containing the component (C), the positive resist composition for immersion exposure according to the present invention is capable of forming a resist film exhibiting high hydrophobicity. Generally, when the hydrophobicity of a resist film is enhanced, the contact angles against water, such as the static contact angle (the contact angle between the surface of a water droplet on the resist film in a horizontal state and the resist film surface), the dynamic contact angle (the contact angle at which a water droplet starts to slide when the resist film is inclined, including the contact angle at the front-end point of the water droplet in the sliding direction (advancing angle) and the contact angle at the rear-end point of the water droplet in the sliding direction (receding angle)) and sliding angle (the inclination angle of the resin film at which a water droplet starts to slide when the resist film is inclined) are changed. For example, higher the hydrophobicity of the resist film, the larger the static contact angle and the dynamic contact angle, and the smaller the sliding angle.

In the present description, the static contact angle, dynamic contact angle and sliding angle are measured in the following manner.

First a resist composition solution is spin-coated onto a silicone substrate, and then heated at a temperature of 90° C. for 90 seconds to form a resist film.

Subsequently, the contact angles can be measured using commercially available measurement apparatuses such as DROP MASTER-700 (manufactured by Kyowa Interface Science Co. Ltd.), AUTO SLIDING ANGLE: SA-30 DM (manufactured by Kyowa Interface Science Co. Ltd.), and AUTO DISPENSER: AD-31 (manufactured by Kyowa Interface Science Co. Ltd.).

The above-mentioned various angles (static contact angle, dynamic contact angle (advancing angle, receding angle) and sliding angle) can be adjusted by adjusting the amount of the component (C) and varying the type of the component (A). For example, the larger the amount of the component (C), the higher the hydrophobicity of the obtained resist film, and hence, the larger the static contact angle and the dynamic contact angle, and the smaller the sliding angle.

With respect to a resist film formed using the resist composition for immersion exposure according to the present invention, it is preferable that the receding angle as measured prior to immersion exposure be 55 degrees or more, more preferably 55 to 150 degrees, still more preferably 60 to 130 degrees, and most preferably 70 to 100 degrees. When the receding angle is 55 degrees or more, the effect of suppressing the elution of a substance during the immersion exposure is enhanced. The reason for this has not been elucidated yet but it is presumed that one of the man reasons is related to the hydrophobicity of the resist film. More specifically, it is presumed that since an aqueous substance such as water is used as the immersion medium, higher hydrophobicity has an influence on the swift removal of the immersion medium from the surface of the resist film after the immersion exposure. On the other band, when the receding angle is 150 degrees or less, the lithography properties become satisfactory.

By containing the component (C), the positive resist composition for immersion exposure according to the present invention is capable of forming a resist film exhibiting high hydrophobicity, as compared to a positive resist composition for immersion exposure which does not contain the component (C). Therefore, a resist film formed from the positive resist composition for immersion exposure according to the present invention exhibits extremely high level of water tracking ability which is required when immersion exposure is performed using a scanning-type immersion exposure apparatus as disclosed in Non-Patent Document 1. Further, by using the positive resist composition for immersion exposure according to the present invention, elution of a substance into the immersion medium during immersion exposure can be suppressed. As a result, during immersion exposure, degeneration of the resist film and change in refractive index of the immersion medium can also be suppressed. Furthermore, as a result of suppression of change in refractive index of the immersion medium and the like, a resist pattern having an excellent shape can be formed. Still further, the level of staining of the lens within the exposure apparatus can be reduce. Therefore, there is no need for protection against these disadvantages, and hence, the present invention can contribute to simplifying the process and the exposure apparatus. Still further, a resist film formed from the positive resist composition for immersion exposure according to the present invention is hardly swollen by water, and hence, an extremely fine pattern can be precisely formed.

Differing from resist compositions for immersion exposure containing a conventional fluorine-containing polymeric compound, the positive resist composition for immersion exposure containing the component (C) is capable of forming a resist film exhibiting about the same low level of hydrophobicity as a resist film formed from a positive resist composition for immersion exposure containing no component (C). The reason for this effect has not yet been elucidated, but is presumed as follows. As described above, in the component (C), the hemiacetal portion is eliminated by acid, and is likely to generate a free carboxy group. Further, in unexposed portions, i.e., portions of the resist film covered with a mask, acid is generated at the resist film surface by the radial rays which barely reached the resist film surface through the mask during exposure. By conducting PEB in the presence of an extremely small amount of the acid generated by the small exposure dose, the hemiacetal portion is eliminated by acid and a free carboxy group is generated even at unexposed portions of the resist film surface. As a result, it is presumed that the resist film exhibits about the same low level of hydrophobicity as a resist film formed from a positive resist composition for immersion exposure containing no component (C), not only at exposed portions of the resist film surface, but also at unexposed portions of the resist film surface.

Thus, the hydrophobicity of the unexposed portions of the resist film surface is reduced. As a result, it is expected that a foreign substance such as a positive resist composition for immersion exposure dissolved by the developing solution hardly adheres to the resist film surface, and hence, the state of the resist film surface can be improved.

Further, by appropriately selecting the component (C), the eliminated hemiacetal portions can be removed by gasification by PEB, and hence, the eliminated hemiacetal portions can be effectively prevented from adhering to the resist film surface. As preferable examples of such a component (C), there can be exemplified a fluorine-containing compound obtained by polymerizing only polymerizable monomers represented by general formula (c1-0) above in which $R^2$ represents an aliphatic hydrocarbon group that has at least one fluorine atom, and may have an oxygen atom and/or a sulfur atom, and a fluorine-containing polymeric compound consisting of a structural unit (c1) represented by general formula (c1-1) in which $R^2$ represents an aliphatic hydrocarbon group that has at least one fluorine atom, and may have an oxygen atom and/or a sulfur atom. As the component (C), it is particularly desirable to use a fluorine-containing polymeric compound obtained by polymerizing only 1-(2,2,2-trifluoroethoxy)ethyl(meth)acrylate or 1-[2-(2,2,2-trifluoroethoxy)ethoxy]ethyl (meth)acrylate.

Furthermore, the positive resist composition for immersion exposure according to the present invention exhibits excellent properties with respect to sensitivity, resolution, etching resistance and the like, and hence, when the positive resist composition is used in immersion exposure, a pattern can be formed without any practical problems. For example, by using the positive resist composition for immersion exposure according to the present invention, an extremely fine pattern with a dimension of no more than 120 mm can be formed.

Thus, the positive resist composition for immersion exposure according to the present invention not only exhibits excellent lithography properties (e.g., sensitivity, resolution, etching resistance and the like), but also exhibits excellent ability of suppressing elution of a substance, and excellent water tracking ability. In addition, the resist film surface becomes hydrophilic following PEB. As a result, it is expected that a foreign substance such as a positive resist composition for immersion exposure dissolved by the developing solution is prevented from adhering to the resist film surface, and hence, the resist film surface can be improved. Therefore, since the positive resist composition for immersion exposure according to the present invention exhibits not only excellent lithography properties, but also excellent properties required as a resist material for immersion exposure, the positive resist composition can be preferably used for immersion exposure.

<<Method of Forming a Resist Pattern>>

Next, the method of forming a resist pattern according to the second aspect of the present invention will be described.

The method of forming a resist pattern according to the present invention includes: applying a positive resist composition for immersion exposure according to the first aspect of the present invention to a substrate to form a resist film on the substrate; subjecting the resist film to immersion exposure; and alkali developing the resist film to form a resist pattern.

A preferable example of the method for forming a resist pattern according to the second aspect of the present invention will be described below.

Firstly, a positive resist composition for immersion exposure according to the first aspect of the present invention is applied onto a substrate using a spinner or the like, and a prebake (post applied bake (PAB)) is conducted for 40 to 120 seconds, preferably 60 to 90 seconds to form a resist film.

The substrate is not specifically limited and a conventionally known substrate can be used. For example, substrates for electronic components, and such substrates having patterns formed thereon can be exemplified. Specific examples of the material of the substrate include metals such as silicon wafer, copper, chromium, iron and aluminum; and mass. Suitable materials for the wiring pattern include copper, aluminum, nickel, and gold.

Further, as the substrate, any one of the above-exemplified substrates provided with an inorganic and/or organic film on the surface thereof may be used. As the inorganic film; an inorganic antireflection film (inorganic BARC) can be exemplified. As the organic film, an organic antireflection film (organic BARC) and an organic film such as a lower-layer organic film used in a multilayer resist method can be exemplified.

Here, a "multilayer resist method" is method in which at least one layer of an organic film (lower-layer organic film) and at least one layer of a resist film (upper resist film) are provided on a substrate, and a resist pattern formed on the upper resist film is used as a mask to conduct patterning of the lower-layer organic film. This method is considered as being capable of forming a pattern with a high aspect ratio. More specifically, in the multilayer resist method, a desired thickness can be ensured by the lower-layer organic film, and as a result, the thickness of the resist film can be reduced, and an extremely fine pattern with a high aspect ratio can be formed.

The multilayer resist method is broadly classified into a method in which a double-layer structure consisting of an upper-layer resist film and a lower-layer organic film is formed (double-layer resist method), and a method in which a multilayer structure having at least three layers consisting of an upper-layer resist film, a lower-layer organic film and at least one intermediate layer (thin metal film or the like) provided between the upper-layer resist film and the lower-layer organic film.

After formation of a resist film, an organic antireflection film may be provided on the resist film, thereby forming a triple layer laminate consisting of the substrate, the resist film and the antireflection film. The anti-reflection film provided on top of the resist film is preferably soluble in an alkali developing solution.

The steps up until this point can be conducted by using conventional techniques. The operating conditions and the like are appropriately selected depending on the formulation and the characteristics of the positive resist composition for immersion exposure being used.

Subsequently, the obtained resist film is subjected to selective immersion exposure through a desired mask patter. At this time, the region between the resist film and the lens at the lowermost point of the exposure apparatus is pre-filled with a solvent (immersion medium) that has a larger refractive index than the refractive index of air, and the exposure (immersion exposure) is conducted in this state.

There are no particular limitations on the wavelength used for the exposure, and an ArF excimer laser, KrF excimer laser or $F_2$ excimer laser or the like can be used. The resist composition according to the present invention is effective for KrF or ArF excimer lasers, and is particularly effective for ArF excimer lasers.

The immersion medium preferably exhibits a refractive index larger than the refractive index of air but smaller than the refractive index of the resist film formed from the resist composition for immersion exposure. The refractive index of the immersion medium is not particularly limited as long at it satisfies the above-mentioned requirements.

Examples of this immersion medium which exhibits a refractive index that is larger than the refractive index of air but smaller than the refractive index of the resist film include water, fluorine-based inert liquids, silicon-based solvents and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, which have a boiling point within a age from 70 to 180° C. and preferably from 80 to 160° C. A fluorine-based inert liquid having a boning point within the above-mentioned range is advantageous in that the removal of the immersion medium after the exposure can be conducted by a simple method.

As a fluorine-based inert liquid, a perfluoroalkyl compound in which all of the hydrogen atoms of the alkyl group are substituted with fluorine atoms is particularly desirable. Examples of these perfluoroalkyl compounds include perfluoroalkylether compounds and perfluoroalkylamine compounds.

Specifically, one example of a suitable perfluoroalkylether compound is perfluoro(2-butyl-tetrahydrofuran) (boiling point 102° C.), and an example of a suitable perfluoroalkylamine compound is perfluorotributylamine (boiling point 174° C.).

A positive resist composition for immersion exposure according to the present invention is particularly resistant to any adverse effects caused by water, and because the resulting sensitivity and shape of the resist pattern profile are excellent, water is preferably used as the immersion medium which exhibits a refractive index that is larger than the refractive index of air. Furthermore, water is also preferred in terms of cost, safety, environmental friendliness, and versatility.

Subsequently, following completion of the immersion exposure step, post exposure baking (PEB) is conducted at 80 to 150° C. for 40 to 120 seconds, preferably 60 to 90 seconds. Then, a developing treatment is performed using for example, a 0.1 to 10% by weight aqueous solution of tetramethylammonium hydroxide. Thereafter water rinse is preferably conducted with pure water, followed by drying. This water rinse can be conducted by dripping or spraying water onto the surface of the substrate while rotating the substrate, and washes away the developing solution and those portions of the positive resist composition for immersion exposure that have been dissolved by the developing solution. Further, a bake treatment (post bake) can be conducted following the developing treatment. In this manner, a resist pattern is obtained in which the resist film (coating of the positive resist composition for immersion exposure) has been patterned into a shape faithful to the mask pattern.

EXAMPLES

As follows is a description of examples of the present invention, although the scope of the present invention is by no way limited by these examples.

Synthesis Example 1

Synthesis of 1-[2-(2,2,2-trifluoroethoxy)ethoxy]ethyl methacrylate 56.0 g of methacrylic acid, 0.13 g of phosphoric acid and 111 g of toluene were charged into a four-necked flask equipped with a stirrer, a thermometer and an inlet fox nitrogen. The four-necked flask was purged with nitrogen, and 22.1 g of 2-(2,2,2-trifluoroethoxy)methylvinylether was added thereto over 2 hours while maintaining the contained liquid at 23° C. Then, the content was stirred for 4.5 hours. The resulting reaction liquid was added to 345 g of 10% by weight aqueous solution of sodium carbonate, and the resultant was stirred. Thereafter, the organic phase was separated, and washed three times with 111 g of 10% aqueous solution of sodium carbonate, followed by washing two times with 111 g of pure water, and concentrated under reduced pressure. The resulting concentrated liquid was distilled under reduced pressure and purified, thereby obtaining 28.4 g of 1-[2-(2,2,2-trifluoroethoxy)ethoxy]ethyl methacrylate represented by formula (c1-0-1-1) shown below (yield; 85%). 2-(2,2,2-trifluoroethoxy)ethylvinylether was synthesized in accordance with the method described in Macromolecules, 32, 7122 (1999).

[Chemical Formula 46]

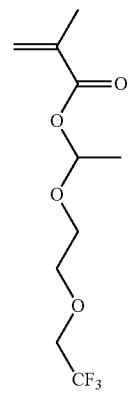

(c1-0-1-1)

[Spectrum data of 1-[2-(2,2,2-trifluoroethoxy)ethoxy] ethyl metacrylate] $^1$H-NMR (CDCl$_3$) δ: 1.46 (d, 3H), 1.95 (s, 3H), 3.72 (m, 6H), 5.61 (s, 1H), 6.01 (q, 1H), 6.16 (s, 1H)

Synthesis Example 2

Synthesis of 1-(2,2,2-trifluoroethoxy)ethyl methacrylate)

Substantially the same operations as in Synthesis Example 1 was performed, except that 16.4 g of 2,2,2-trifluoroethylvinylether (manufactured by Lancaster) was used instead of 22.1 g of 2-(2,2,2-trifluoroethoxy)ethylvinylether, and 0.13 g of sulfuric acid was used instead of 0.13 g of phosphoric acid, thereby obtain 22.1 g of 1-(2,2,2-trifluoroethoxy)ethyl methacrylate represented by formula (c1-2-1) shown below (yield: 80%).

[Chemical Formula 47]

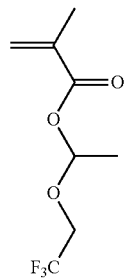

(c1-0-2-1)

[Spectrum data of 1-(2,2,2-trifluoroethoxy)ethyl methacrylate] $^1$H-NMR (CDCl$_3$) δ: 1.50 (d, 3H), 1.96 (m, 3H), 3.98-4.10 (m, 2H), 5.65 (m, 1H), 6.02 (t, 1H), 6.18 (m, 1H)

Synthesis Example 3

1-1 Synthesis of Fluorine-Containing Polymeric Compound 1

33.0 g of propylene glycol monomethyl ether acetate (PGMEA) was charged into a separable flask equipped with a stirrer, a thermometer, a dropping funnel and a nitrogen inlet tube, and the temperature thereof was elevated to 65° C. Separately, 15.0 g of 1-[2-(2,2,2-trifluoroethoxy)ethoxy] ethyl methacrylate and 0.83 g of 2,2'-azobis(2,4-dimethylvaleronitrile) (an initiator manufactured by Wako Pure Chemical Industries, Ltd.; product name: V-65) were added to 68.3 g of PGMEA to obtain a mixed solution. Then, the obtained mixed solution was dropwise added to the separable flask over 6 hours, followed by aging for 2 hours. The resulting reaction liquid was dropwise added to 1,163 g of heptane, and the precipitated polymer recovered using a Buchner funnel. The recovered polymer was dried under reduced pressure, thereby obtaining 9.5 g of a fluorine-containing polymeric compound 1 represented by chemical formula (c1-1-1-1) shown below. The obtained fluorine-containing polymeric compound 1 had a weight average molecular weight (Mw) of 7,600 and a dispersity (Mw/Mn) of 1.61 polystyrene equivalent value determined by GPC).

[Chemical Formula 48]

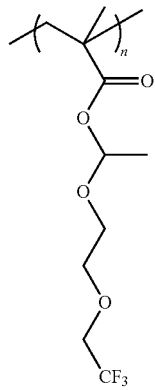

(c1-1-1-1)

Synthesis Example 4

1-2 Synthesis of Fluorine-Containing Polymeric Compound 2

Substantially the same operations as in Synthesis Example 3 was performed, except that 15.0 g of 1-(2,2,2-trifluoroethoxy)ethyl methacrylate was used instead of 15.0 g of 1-[2-(2,2,2-trifluoroethoxy)ethoxy]ethyl methacrylate, and the amount of 2,2'-azobis(2,4-dimethylvaleronitrile) was changed from 0.83 g to 0.98 g, thereby obtaining 7.2 g of a fluorine-containing polymeric compound 2 represented by chemical formula (c1-2-1) shown below. The obtained fluorine-containing polymeric compound 2 had a weight average molecular weight (Mw) of 8,900 and a diversity (Mw/Mn) of 1.87 (polystyrene equivalent value determined by GPC).

[Chemical Formula 49]

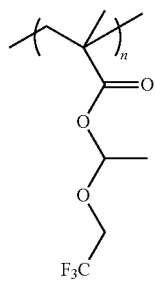

(c1-1-2-1)

Examples 1 to 8 and Comparative Example 1

The components shown in Table 1 were mixed together and dissolved to obtain positive resist compositions for immersion exposure.

TABLE 1

|  | Component (A) | Component (B) | Component (C) | Component (D) | Component (S) |
| --- | --- | --- | --- | --- | --- |
| Comp. Ex. 1 | (A)-1 [100] | (B)-1 [8] | — | (D)-1 [1.2] | (S)-1 [2200] |
| Example 1 | (A)-1 [100] | (B)-1 [8] | (C)-1 [0.5] | (D)-1 [1.2] | (S)-1 [2200] |
| Example 2 | (A)-1 [100] | (B)-1 [8] | (C)-1 [1.0] | (D)-1 [1.2] | (S)-1 [2200] |
| Example 3 | (A)-1 [100] | (B)-1 [8] | (C)-1 [2.0] | (D)-1 [1.2] | (S)-1 [2200] |
| Example 4 | (A)-1 [100] | (B)-1 [8] | (C)-1 [5.0] | (D)-1 [1.2] | (S)-1 [2200] |
| Example 5 | (A)-1 [100] | (B)-1 [8] | (C)-2 [0.5] | (D)-1 [1.2] | (S)-1 [2200] |
| Example 6 | (A)-1 [100] | (B)-1 [8] | (C)-2 [1.0] | (D)-1 [1.2] | (S)-1 [2200] |
| Example 7 | (A)-1 [100] | (B)-1 [8] | (C)-2 [2.0] | (D)-1 [1.2] | (S)-1 [2200] |
| Example 8 | (A)-1 [100] | (B)-1 [8] | (C)-2 [5.0] | (D)-1 [1.2] | (S)-1 [2200] |

In Table 1, the reference characters indicate the following. Further, the values in brackets [ ] indicate the amount (in terms of parts by weight) of the component added.

(A)-1: A copolymer represented by formula (A)-1 shown below (Mw=7,000, Mw/Mn=1.8). In the formula, the subscript numerals of the respective structural units indicate the percentage (mol %) of the respective structural units within the copolymer.

(B)-1: (4-methylphenyl)diphenylsulfonium nonafluoro-n-butane sulfonate (C)-1: Fluorine containing polymeric compound 1 obtained in Synthesis Example 3

(C)-2: Fluorine containing polymeric compound 2 obtained in Synthesis Example 4

(D)-1: tri-n-pentylamine (S)-1: a mixed solvent of PGMEA/PGM=6/4 (weight ratio)

[Chemical Formula 50]

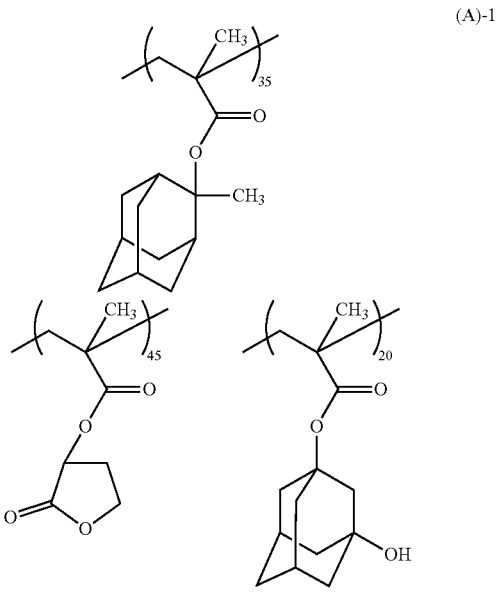

(A)-1

With respect to the obtained positive resist compositions for immersion exposure, the following evaluations were performed.

<Hydrophobicity Evaluation 1>

The static contact angle prior to exposure was measured in the following manner, to thereby evaluate the hydrophobicity of the resist film.

An organic anti-reflection film composition (product name: ARC-29A, manufactured by Brewer Science Ltd.) was applied onto the surface of an 8-inch silicon wafer using a spinner, ad the composition was then baked at 205° C. for 60 seconds, thereby forming an organic anti-reflection film having a thickness of 82 nm. Each of the positive resist composition obtained in Examples 1 to 8 and Comparative Example 1 was applied onto the surface of the anti-reflection film using a spinner, and was then prebaked on a hotplate at 110° C. for 60 seconds and dried, thereby forming a resist film having a film thickness of 150 nm.

Subsequently, 2 μL of water was dropped onto the surface of the resist film (prior to exposure), and the static contact angle was measured using DROP MASTER-700 (manufactured by Kyowa Interface Science Co. Ltd.).

The measurement results of the static angle of the resist film prior to exposure are shown in Table 2. Further, in Table 2, the amounts of the component (C) added, based on the amount of the component (A) (hereafter, simply referred to as component (C) ratio (unit: % by weight)) are also shown. In Table 2, "Comparative Example 1" and "Examples 1 to 8" indicate the resist films formed using the resist compositions of Comparative Example 1 and Examples 1 to 8.

As seen from the measurement results, in Examples 1 to 8 in which the component (A) was used in combination with the component (C), the static contact angle of the resist film prior to exposure was larger than that of Comparative Example 1 in which the component (C) was not used. Thus, from the results, it was confirmed that the resist films formed from the positive resist compositions of Examples 1 to 8 exhibited high hydrophobicity, as compared to the resist film formed from the resist composition of Comparative Example 1.

TABLE 2

| | Component (C) ratio (% by weight) | Static contact angle prior to exposure (degrees) |
|---|---|---|
| Comp. Ex. 1 | 0 | 67.1 |
| Example 1 | 0.5 | 74.1 |
| Example 2 | 1 | 80 |
| Example 3 | 2 | 82.2 |
| Example 4 | 5 | 82.4 |
| Example 5 | 0.5 | 82.5 |
| Example 6 | 1 | 89 |
| Example 7 | 2 | 90.8 |
| Example 8 | 5 | 93 |

<Hydrophobicity Evaluation 2>

Using the positive resist compositions for immersion exposure of Examples 2 and 6 and Comparative Example 1, resist films were formed in the same manner as in the hydrophobicity evaluation 1. Subsequently, each of the resist films was selectively irradiated with an ArF excimer laser (193 nm), using an ArF exposure apparatus NSR-S302A (manufactured by Nikon Corporation, NA (numerical aperture)=0.60, σ=0.75), and an open frame exposure (exposure without a mask) was performed with the exposure dose indicated in Table 3. Thereafter, a PEB treatment was conducted at 110° C. for 60 seconds. Following the PEB treatment, the static contact angle of the resist film (after exposure) was measured in the same manner as described above. The measurement results of the static angle of the resist film after exposure are shown in Table 3. In Table 3, "Example 2", "Example 6" and "Comparative Example 1" indicate the resist films formed using the resist compositions of Examples 2 and 6 and Comparative Example 1.

TABLE 3

| Exposure dose | Static contact angle after PEB treatment (degrees) | | |
|---|---|---|---|
| (mJ/cm$^2$) | Comp. Ex. 1 | Example 2 | Example 6 |
| 1 | 64.3 | 79.3 | 89 |
| 2 | 51.9 | 77.1 | 86.7 |
| 3 | 50.6 | 61 | 84.9 |
| 4 | 51.5 | 58.4 | 73.6 |
| 5 | 53.4 | | 85.4 |
| 6 | | | 56.1 |
| 7 | | | 51.4 |
| 8 | | | 51.7 |
| 9 | | | 52.4 |
| 10 | | | 53.2 |

With respect to the resist films formed from the resist compositions of Examples 2 and 6 in which the component (C) ratio was 1% by weight, it was confirmed that the static contact angle became smaller in an exposure-dose dependent manner by conducting a PEB treatment after exposure. Especially, with respect to the resist film of Example 6, when the exposure dose was no more than 2 mJ/cm$^2$, the static contact angle was as large as almost 90 degrees and hardly changed after the FEB treatment. However, as the exposure dose increased the static contact angle became smaller and became about 50 degrees with an exposure dose of 6 mJ/cm$^2$ or more, which was about the same as the resist film of Comparative Example 1.

From the results, it is fairly evidenced that a resist film formed from a positive resist composition for immersion exposure according to the present invention (i.e., a resist composition containing the component (C)) has a characteristic feature in that it exhibits a favorable hydrophobicity during immersion exposure, and after PEB treatment, the level of hydrophobicity is reduced to substantially the same level as a resist film formed from a positive resist composition for immersion exposure containing no component (C).

<Evaluation of Lithography Properties>

Using the positive resist compositions for immersion exposure of Examples 1 to 8 and Comparative Example 1, resist films were formed in the same manner as in the hydrophobicity evaluation. Subsequently, each of the resist films was selectively irradiated with an ArF excimer laser (193 nm) through a mask pattern using an ArF exposure apparatus NSR-S302A (manufactured by Nikon Corporation, NA (numerical aperture)=0.60, σ=0.75). Thereafter, a PEB treatment was conducted at 10° C. for 60 seconds, followed by development for 30 seconds at 23° C. in a 2.38% by weight aqueous solution of tetramethylammonium hydroxide.

As a result, it was found that each of the positive resist compositions for immersion exposure were capable of forming a L/S pattern having a line width of 120 nm and a pitch of 240 nm.

As seen from the results, the positive resist compositions for immersion exposure of Examples 1 to 8 also exhibited excellent performance with respect to lithography properties.

As a result, it was confirmed that the positive resist compositions for immersion exposure of Examples 1 to 8 containing the component (A), the component (B) and the component (C) were capable of forming resist films exhibiting not only satisfactory properties required as a resist material for immersion exposure, but also excellent lithography properties.

The invention claimed is:

1. A positive resist composition for immersion exposure comprising a base component (A) which exhibits increased solubility in an alkali developing solution under action of acid and does not contain a structural unit (c1) represented by a general formula (c1-1) shown below, an acid-generator component (B) which generates acid upon irradiation, and a fluorine-containing polymeric compound (C) obtained by polymerizing only polymerizable monomers represented by a general formula (c1-0) shown below:

[Chemical Formula 1]

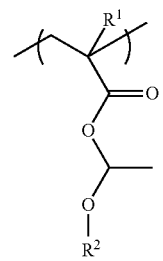

(c1-1)

wherein R$^1$ represents a hydrogen atom or a methyl group; R$^2$ represents an aliphatic hydrocarbon group substituted with fluorine atoms, or a group in which a plurality of aliphatic hydrocarbon groups which may be substituted with fluorine atoms are bonded through a linking group containing a hetero atom, with the proviso that at least one of the plurality of aliphatic hydrocarbon groups which may be substituted with fluorine atoms is an aliphatic hydrocarbon group substituted with fluorine atoms; and

[Chemical Formula 2]

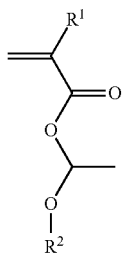

(c1-0)

wherein $R^1$ represents a hydrogen atom or a methyl group; $R^2$ represents an aliphatic hydrocarbon group substituted with fluorine atoms, or a group in which a plurality of aliphatic hydrocarbon groups which may be substituted with fluorine atoms are bonded through a linking group containing a hetero atom, with the proviso that at least one of the plurality of aliphatic hydrocarbon groups which may be substituted with fluorine atoms is an aliphatic hydrocarbon group substituted with fluorine atoms.

2. The positive resist composition for immersion exposure according to claim 1, wherein said base component (A) is a resin (A1) which has acid dissociable, dissolution inhibiting groups and exhibits increased solubility in an alkali developing solution under action of acid.

3. The positive resist composition for immersion exposure according to claim 2, wherein said resin (A1) has a structural unit (a1) derived from an acrylate ester containing an acid dissociable, dissolution inhibiting group.

4. The positive resist composition for immersion exposure according to claim 3, wherein said resin (A1) further comprises a structural unit (a2) derived from an acrylate ester containing a lactone-containing cyclic group.

5. The positive resist composition for immersion exposure according to claim 3, wherein said resin (A1) further comprises a structural unit (a3) derived from an acrylate ester containing a polar group-containing aliphatic hydrocarbon group.

6. The positive resist composition for immersion exposure according to claim 1, which further comprises a nitrogen-containing organic compound (D).

7. A positive resist composition for immersion exposure comprising a base component (A) which exhibits increased solubility in an alkali developing solution under action of acid and does not contain a structural unit (c1) represented by a general formula (c1-1) shown below, an acid-generator component (B) which generates acid upon irradiation, and a fluorine-containing polymeric compound (C) consisting of a structural unit (c1) represented by a general formula (c1-1) shown below:

[Chemical Formula 3]

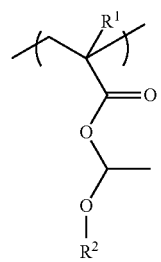

(c1-1)

wherein $R^1$ represents a hydrogen atom or a methyl group; $R^2$ represents an aliphatic hydrocarbon group substituted with fluorine atoms, or a group in which a plurality of aliphatic hydrocarbon groups which may be substituted with fluorine atoms are bonded through a linking group containing a hetero atom, with the proviso that at least one of the plurality of aliphatic hydrocarbon groups which may be substituted with fluorine atoms is an aliphatic hydrocarbon group substituted with fluorine atoms.

8. The positive resist composition for immersion exposure according to claim 7, wherein said base component (A) is a resin (A1) which has acid dissociable, dissolution inhibiting groups and exhibits increased solubility in an alkali developing solution under action of acid.

9. A method of forming a resist pattern, comprising: applying a positive resist composition for immersion exposure of any one of claim 1 to 6 or 8 to a substrate to form a resist film on the substrate; subjecting said resist film to immersion exposure; and alkali developing said resist film to form a resist pattern.

10. A fluorine-containing polymeric compound consisting of a structural unit (c1) represented by general formula (c1-1-1) shown below:

[Chemical Formula 5]

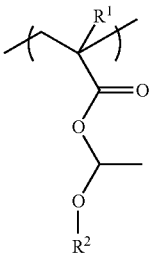

(c1-1-1)

wherein $R^1$ represents a hydrogen atom or a methyl group.

* * * * *